United States Patent
Kinoshita

(10) Patent No.: US 7,532,497 B2
(45) Date of Patent: May 12, 2009

(54) NONVOLATILE SEMICONDUCTOR MEMORY DEVICE AND METHOD OF WRITING INTO THE SAME

(75) Inventor: Kentaro Kinoshita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/959,769

(22) Filed: Dec. 19, 2007

(65) Prior Publication Data
US 2008/0123392 A1    May 29, 2008

Related U.S. Application Data

(63) Continuation of application No. PCT/JP2005/011243, filed on Jun. 20, 2005.

(51) Int. Cl.
*G11C 17/00* (2006.01)
(52) U.S. Cl. ...................................... 365/100; 365/148
(58) Field of Classification Search ................. 365/100, 365/148
See application file for complete search history.

(56) References Cited

U.S. PATENT DOCUMENTS

| | | | |
|---|---|---|---|
| 6,473,332 B1 | 10/2002 | Ignatiev et al. | |
| 7,061,796 B2 * | 6/2006 | Hidaka | ........................ 365/161 |
| 7,129,531 B2 * | 10/2006 | Fournier et al. | ............. 257/209 |
| 2004/0130939 A1 | 7/2004 | Morikawa | |
| 2004/0264244 A1 | 12/2004 | Morimoto | |
| 2007/0159867 A1 * | 7/2007 | Muraoka et al. | ............ 365/100 |

FOREIGN PATENT DOCUMENTS

| | | |
|---|---|---|
| JP | 2004110867 A | 4/2004 |
| JP | 2004185755 A | 7/2004 |
| JP | 2004272975 A | 9/2004 |
| JP | 200525914 A | 1/2005 |

OTHER PUBLICATIONS

A. Beck et al; "Reproducible switching effect in thin oxide films for memory applications"; Applied Physics Letters, vol. 77, p. 139 (2000).
W. W. Zhuang et al.; Novel Colossal Magnetoresistive Thin Film Nonvolatile Resistance Random Access Memory (RRAM); Tech. Digest IEDM 2002, p. 193.
I. G. Baek et al; Highly Scalable Non-volatile Resistive Memory using Simple Binary Oxide Driven by Asymmetric Unipolar Voltage Pulses; Tech. Digest IEDM 2004, p. 587.
International Search Report of PCT/JP2005/011243, date of mailing Feb. 28, 2006.

* cited by examiner

*Primary Examiner*—Son Dinh
*Assistant Examiner*—Nam Nguyen
(74) *Attorney, Agent, or Firm*—Fujitsu Patent Center

(57) ABSTRACT

In a method of writing into a nonvolatile semiconductor memory device including a resistance memory element which memorizes a high resistance state and a low resistance state and switches between the high resistance state and the low resistance state by an application of a voltage, a variable resistor is parallelly connected to the resistance memory element, and when the voltage is applied to the resistance memory element to switch the resistance memory element between the high resistance state and the low resistance state, a resistance value of the variable resistor is set corresponding to the resistance state of the resistance memory element so that a writing circuit for applying the voltage to the resistance memory element, and a synthetic resistor of the resistance memory element and the variable resistor make the impedance-matching.

14 Claims, 17 Drawing Sheets

NONVOLATILE SEMICONDUCTOR MEMORY DEVICE AND METHOD OF WRITING INTO THE SAME

CROSS REFERENCE TO RELATED APPLICATIONS

This application is a Continuation of International Application No. PCT/JP2005/011243, with an international filing date of Jun. 20, 2005, which designating the United States of America, the entire contents of which are incorporated herein by reference.

BACKGROUND OF THE INVENTION

The present invention relates to a nonvolatile semiconductor memory device, more specifically, a nonvolatile semiconductor memory device using a resistance memory element having a plurality of resistance states of different resistance values and a method of writing into the same.

Recently, as a new memory device, a nonvolatile semiconductor memory device called RRAM (Resistance Random Access Memory) is noted. The RRAM uses a resistance memory element which has a plurality of resistance states of different resistance values, which are changed by electric stimulations applied from the outside and whose high resistance state and low resistance state are corresponded to, e.g., information "0" and "1" to be used as a memory element. The RRAM highly potentially has high speed, large capacities, low electric power consumption, etc. and is considered prospective.

The resistance memory element has a resistance memory material whose resistance states are changed by the application of voltages sandwiched between a pair of electrodes. As the typical resistance memory material, oxide materials containing transition metals are known.

The nonvolatile semiconductor memory device using the resistance memory element is disclosed in, e.g., U.S. Pat. No. 6,473,332 (herein after called Reference 1), Japanese published unexamined patent application No. 2005-025914 (herein after called Reference 2), Japanese published unexamined patent application No. 2004-272975 (herein after called Reference 3), Japanese published unexamined patent application No. 2004-110867 (herein after called Reference 4), A. Beck et al., Appl. Phys. Lett., Vol. 77, p. 139 (2000) (herein after called Reference 5), W. W. Zhuang et al., Tech. Digest IEDM 2002, p. 193 (herein after called Reference 6), and I. G. Baek et al., Tech. Digest IEDM 2004, p. 587 (herein after called Reference 6).

However, in the resistance memory element using the resistance memory material described above, the impedance of the cell much varies between the resistance value in the high resistance state and the resistance value in the low resistance state, which makes the impedance matching with outside circuits difficult.

For example, $TiO_x$, which is a typical transition metal oxide, has the resistance value at 0.5 V varied by about 3 places between the high resistance state and the low resistance state. Accordingly, when the impedance in, e.g., the high resistance state is matched with that of an outside circuit, the impedance matching with the outside circuit in the low resistance state is largely broken, and reversely, when the impedance is matched with the outside circuit in the low resistance state, the impedance matching with the outside circuit in the high resistance state is largely broken. Consequently, in high speed operations, voltage pulses are reflected at the connection with the outside circuit, which makes it impossible to apply effectively sufficient voltages to the resistance memory element both in the low resistance state and the high resistance state.

When effectively sufficient voltages cannot be applied to the resistance memory element due to the impedance mismatching, the resistance states cannot be switched, which makes the writing and erasing impossible, and errors take place. To prevent this, the pulse width is elongated to make the voltage application time longer, but this lowers the operation speed.

SUMMARY OF THE INVENTION

One possible object is to provide a nonvolatile semiconductor memory device using resistance memory elements memorizing a plurality of resistance states of different resistance values, which can facilitate the impedance matching between the memory cells and peripheral circuits both when the resistance memory elements are rewritten from the high resistance state to the low resistance state and when rewritten from the low resistance state to the high resistance state, and the method of writing into the same.

According to one aspect of the present invention, there is provided a method of writing into a nonvolatile semiconductor memory device including a resistance memory element which memorizes a high resistance state and a low resistance state and switches between the high resistance state and the low resistance state by an application of a voltage, a variable resistor being parallelly connected to the resistance memory element, and when the voltage is applied to resistance memory element to switch the resistance memory element between the high resistance state and the low resistance state, a resistance value of the variable resistor being set corresponding to a resistance state of the resistance memory element so that a writing circuit for applying the voltage to the resistance memory element, and a synthetic resistor of the resistance memory element and the variable resistor make the impedance-matching.

DETAILED DESCRIPTION OF THE INVENTION

A First Embodiment

The nonvolatile semiconductor memory device and method of writing into the same according to a first embodiment of the present invention will be explained with reference to FIGS. 1 to 9.

Figure 1:
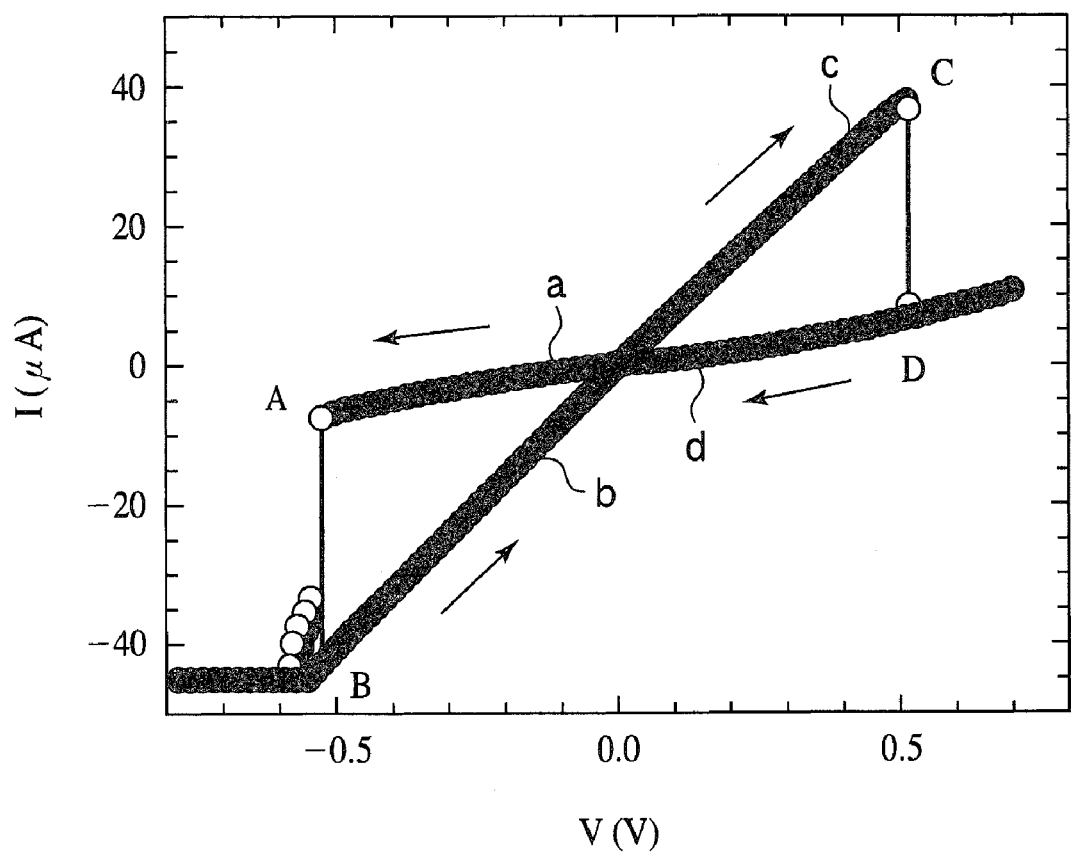
FIG. 1 is a graph showing the current-voltage characteristics of the resistance memory element using a bipolar resistance memory material.
Figure 2:
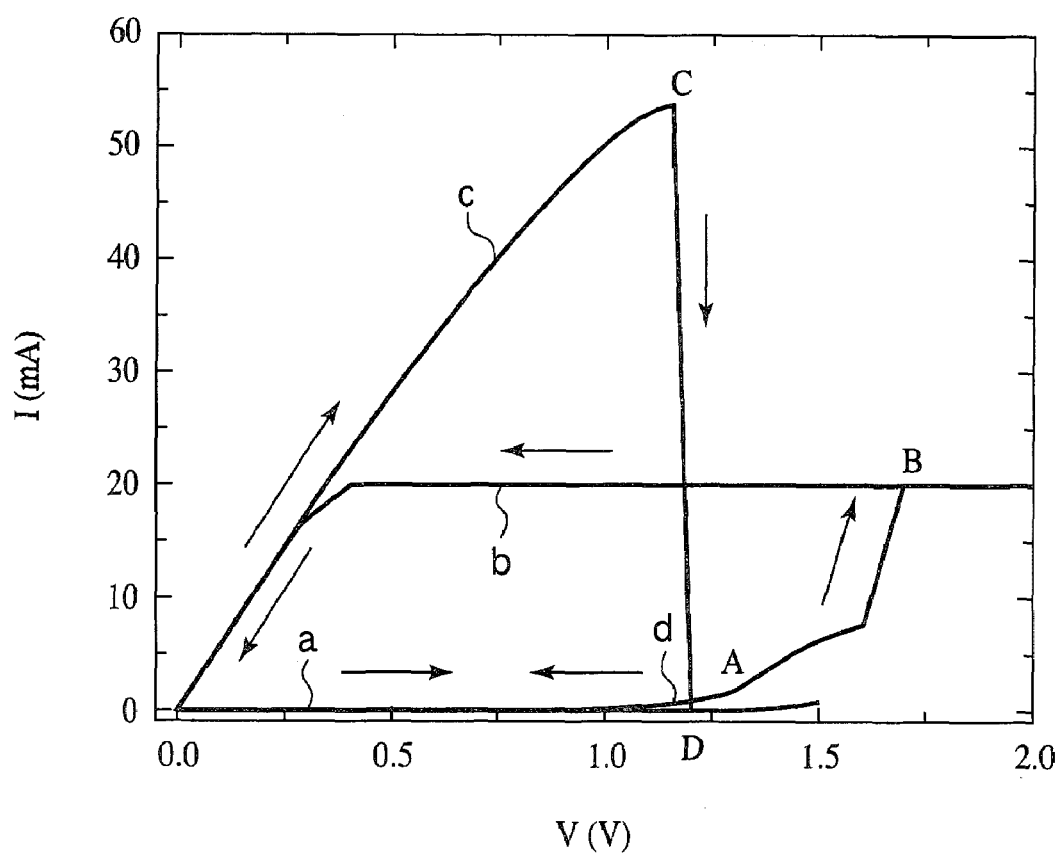
FIGS. 2 and 3 are graphs showing the current-voltage characteristics of the resistance memory element using a unipolar resistance memory material.
Figure 3:
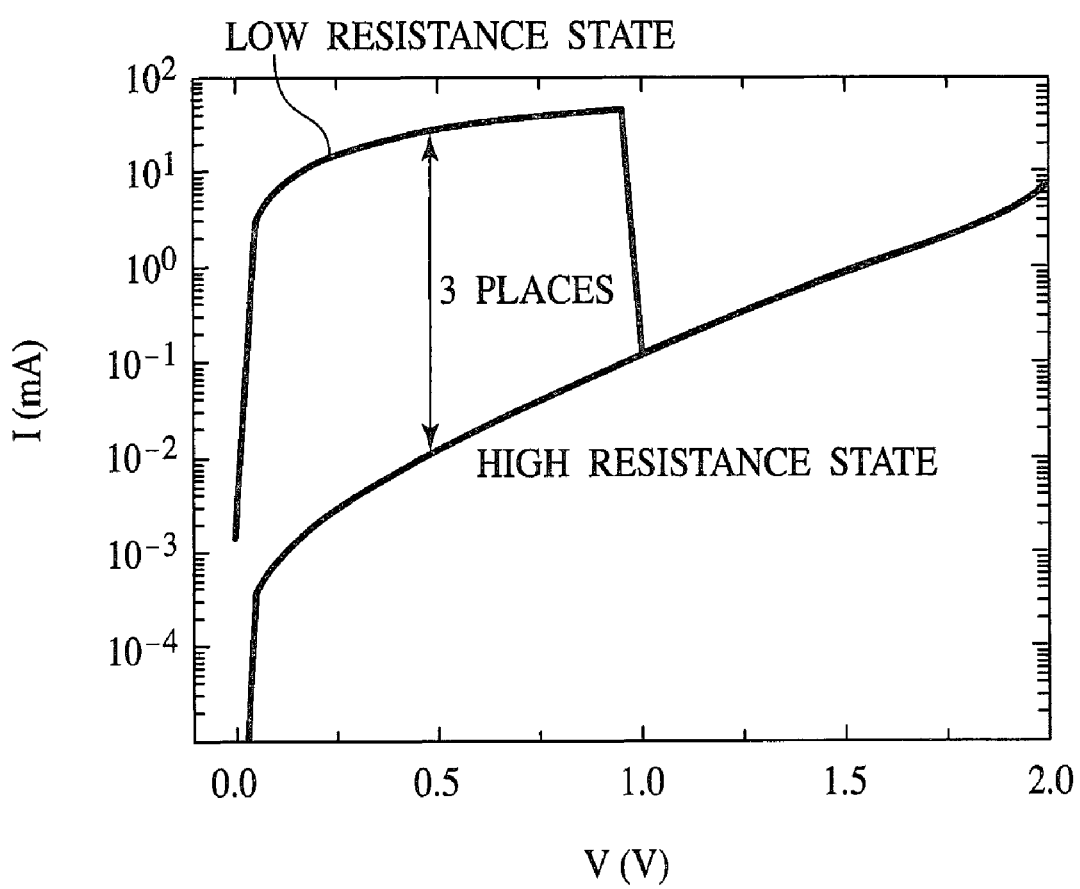
Figure 4:
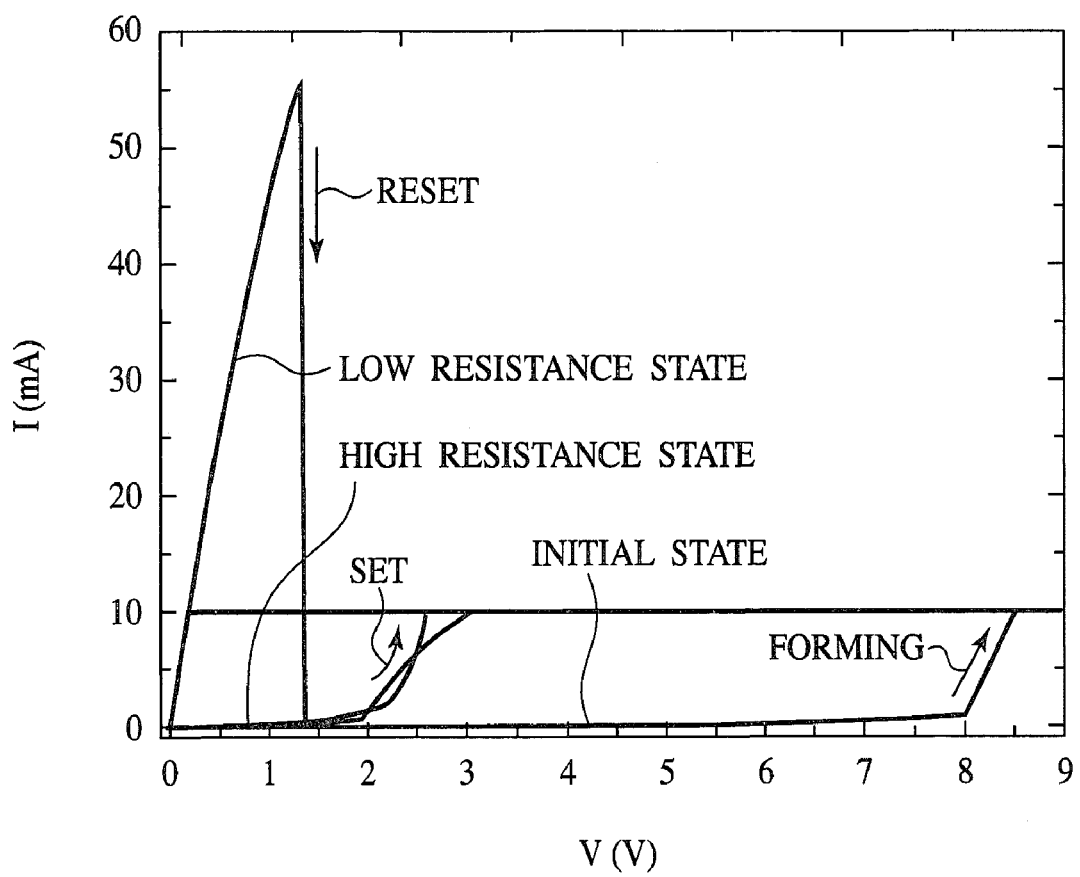
FIG. 4 is a graph showing the current-voltage characteristics of the resistance memory element using a unipolar resistance memory material, which explains the forming process thereof.
Figure 5:
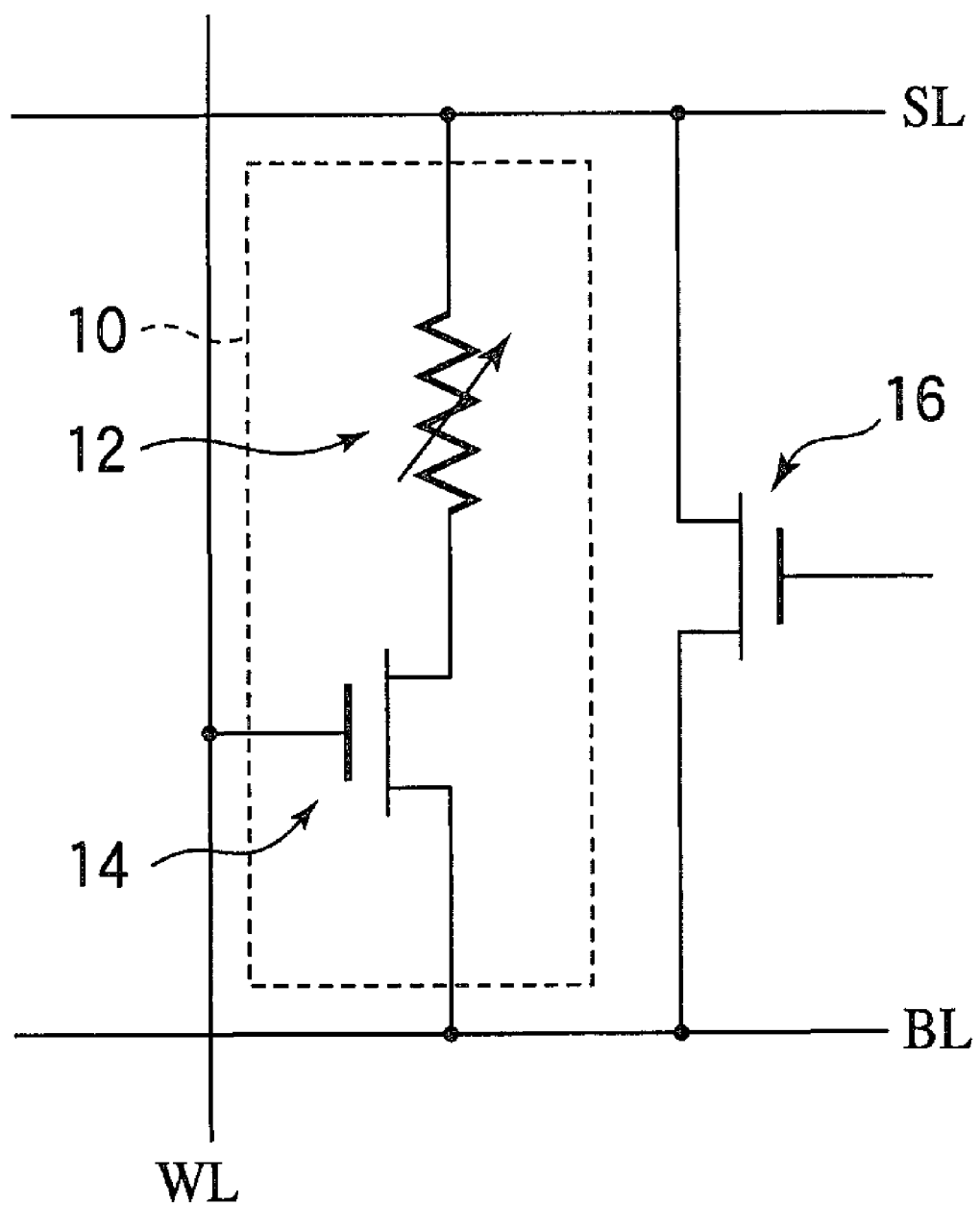
FIGS. 5 and 6 are circuit diagrams showing the structure of the nonvolatile semiconductor memory device according to a first embodiment of the present invention.
Figure 6:
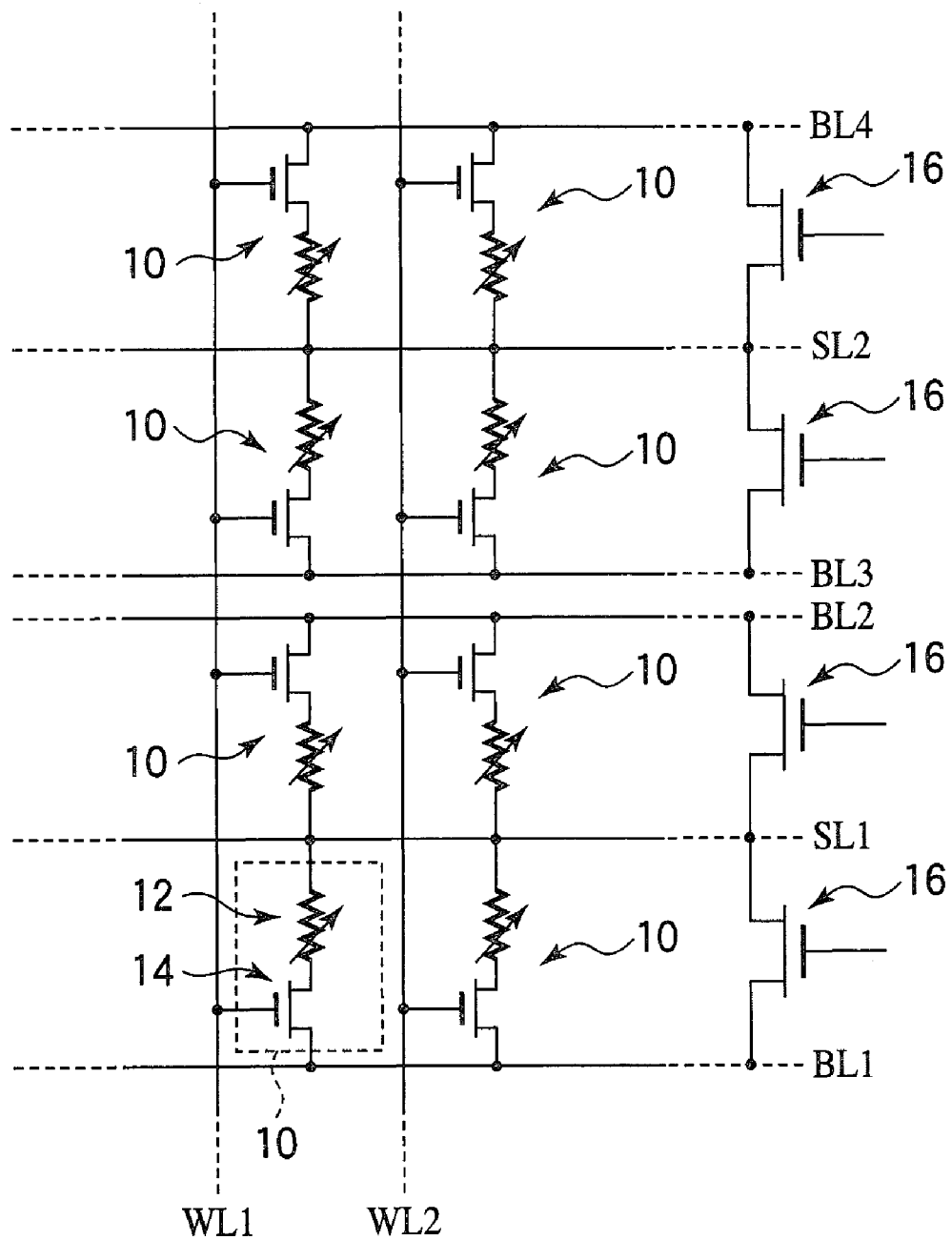
Figure 7:
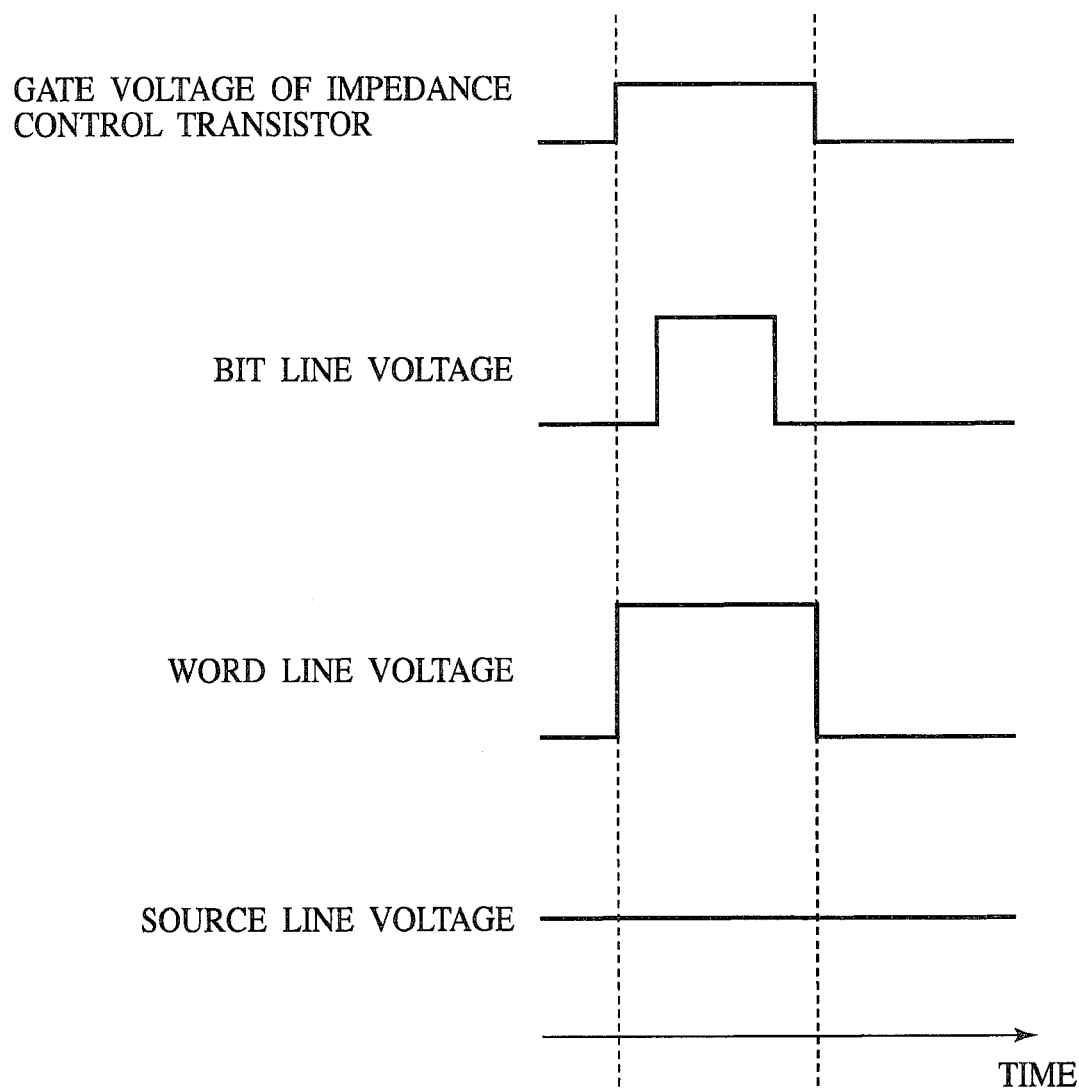
FIGS. 7 and 8 are time charts showing the method of writing into the nonvolatile semiconductor memory device according to the first embodiment of the present invention.
Figure 8:
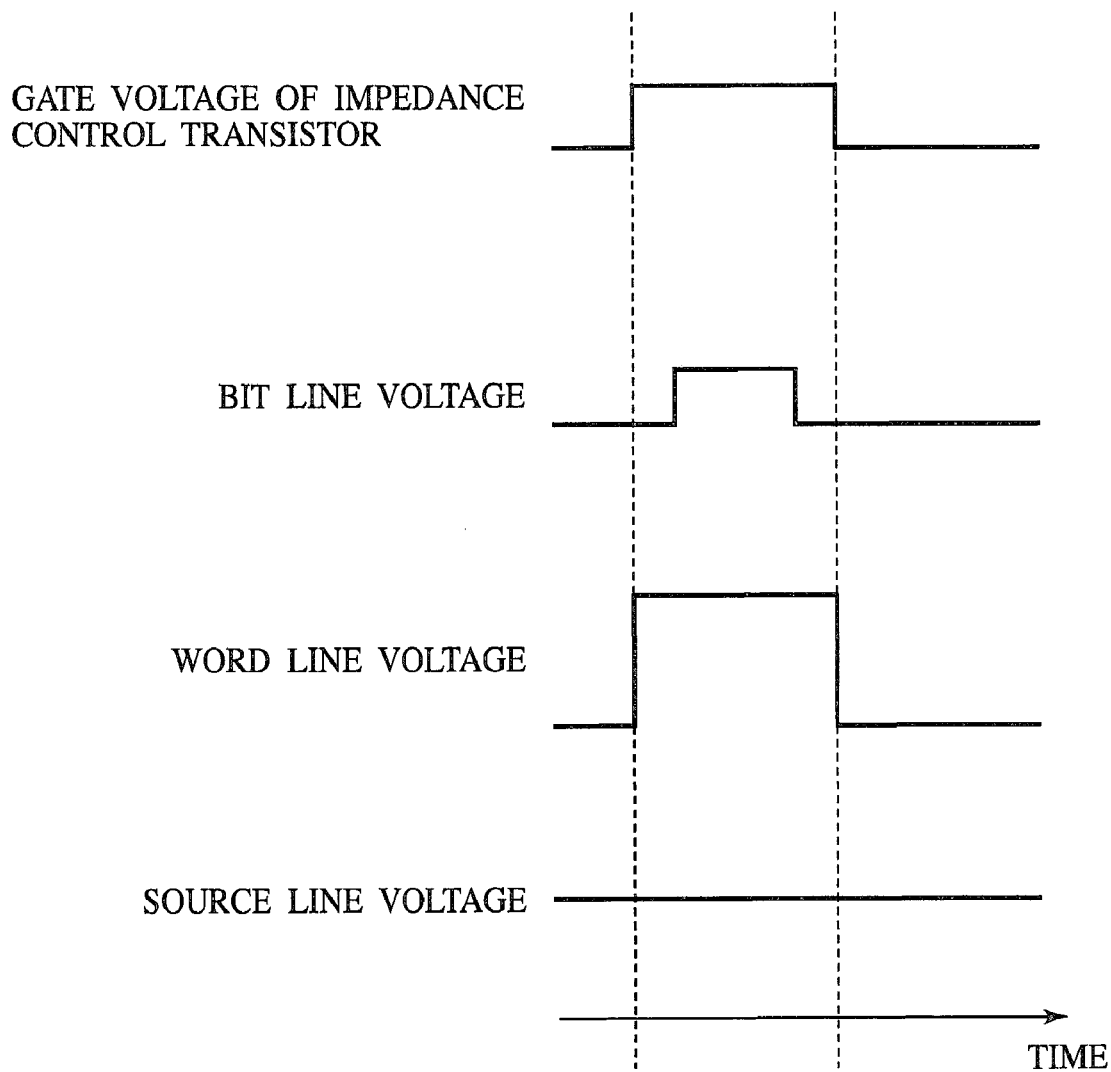
Figure 9:
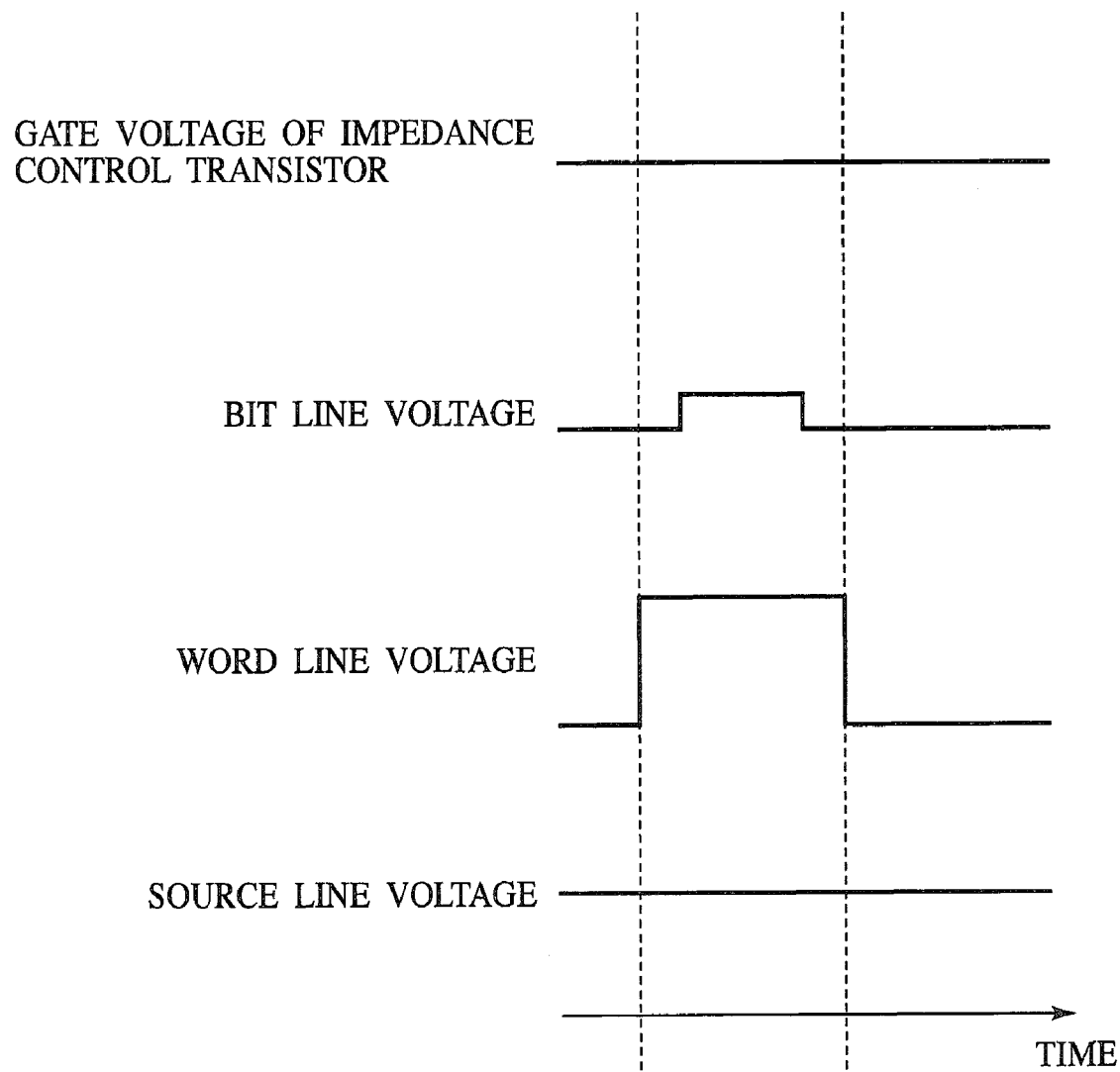
FIG. 9 is a time chart showing the method of reading the nonvolatile semiconductor memory device according to the first embodiment of the present invention.

FIG. 1 is a graph showing the current-voltage characteristics of the resistance memory element using a bipolar resistance memory material. FIGS. 2 and 3 are graphs showing the current-voltage characteristics of the resistance memory element using a unipolar resistance memory material. FIG. 4 is a graph showing the current-voltage characteristics of the resistance memory element using a unipolar resistance memory material, which explains the forming process thereof. FIGS. 5 and 6 are circuit diagrams showing the structure of the nonvolatile semiconductor memory device according to the present embodiment. FIGS. 7 and 8 are time charts showing the method of writing into the nonvolatile semiconductor memory device according to the present embodiment. FIG. 9 is a time chart showing the method of reading the nonvolatile semiconductor memory device according to the present embodiment.

First, the basic operation of the resistance memory element will be explained with reference to FIGS. 1 and 2.

The resistance memory element includes the resistance memory material sandwiched between a pair of electrodes. Many of the resistance memory material are oxide materials containing transition metals, and the resistance memory material is divided largely in two, depending on differences in the electric characteristics.

One of them uses voltages of different polarities so as to change the resistance states between the high resistance state and the low resistance state and includes $SrTiO_3$ and $SrZrO_3$ doped with a trace of an impurity, such as chrome (Cr) or others, and $Pr_{1-x}Ca_xMnO_3$ and $La_{1-x}Ca_xMnO_3$, etc., which exhibit CMR (Colossal Magneto-Resistance). Such resistance memory material which requires voltages of different polarities so as to rewrite the resistance state will be hereinafter called the bipolar resistance memory material.

The other of them is materials which require voltages of the same polarity so as to change the resistance states between the high resistance state and the low resistance state and includes oxides, etc., containing a single transition metal, such as $NiO_x$ and $TiO_x$. Such resistance memory materials which require voltages of the same polarity for rewriting the resistance states will be hereinafter called the unipolar resistance memory material.

FIG. 1 is a graph of the current-voltage characteristics of the resistance memory element using the bipolar resistance memory material and is disclosed in Reference 2. This graph is of the resistance memory element using Cr-doped $SrZrO_3$, which is the typical bipolar resistance memory material.

It is assumed that in the initial state, the resistance memory element is in the high resistance state.

As an applied voltage increases gradually from 0 V to negative voltages, the current flowing at this time changes along the curve "a" in the arrowed direction, and its absolute value gradually increases. When the applied negative voltage is further increased and exceed about −0.5 V, the resistance memory element switches from the high resistance state to the low resistance state. Accompanying this, the absolute value of the current abruptly increases, and the current-voltage characteristics transits from the point A to the point B. In the following explanation, the operation of changing the resistance memory element from the high resistance state to the low resistance state is called "set".

As the negative voltage is gradually decreased from the state at the point B, the current changes along the curve "b" in the arrowed direction, and its absolute value gradually decreases. When the applied voltage returns to 0 V, the current also becomes 0 A.

As the applied voltage increases gradually from 0 V to positive voltages, the current value changes along the curve "c" in the arrowed direction, and its absolute values gradually increases. The applied positive voltage further increases and exceeds about 0.5 V, the resistance memory element switches from the low resistance state to the high resistance state. Accompanying this, the absolute value of the current abruptly decreases, and the current-voltage characteristics transit from the point C to the point D. In the following explanation, the operation of changing the resistance memory element from the low resistance state to the high resistance state is called "reset".

As the positive voltage decreases from the state at the point D, the current changes along the curve "d" in the arrowed direction, and its absolute value gradually decreases. When the applied voltage returns to 0 V, the current also becomes 0 A.

The respective resistance states are stable in the range of about ±0.5 V and can be retained even when the electric power source is turned off. That is, in the high resistance state, when an applied voltage is lower than the absolute value of the voltage at the point A, the current-voltage characteristics changes linearly along the curves "a" and "d", and the high resistance state is retained. Similarly, in the low resistance state, when an applied voltage is lower than the absolute value of the voltage at the point C, the current-voltage characteristics changes linearly along the curves "b" and "c", and the low resistance state is retained.

As described above, for the resistance memory element using the bipolar resistance memory material, to change the resistance state between the high resistance state and the low resistance state, voltages of different polarities are applied.

FIG. 2 is a graph of the current-voltage characteristics of the resistance memory element using the unipolar resistance memory material. This graph is of the resistance memory element using $TiO_x$, which is the typical unipolar resistance memory material.

It is assumed that in the initial state, the resistance memory element is in the high resistance state.

As an applied voltage is increased gradually from 0 V, the current increases along the curve "a" in the arrowed direction, and its absolute value gradually increases. When the applied voltage gradually increases and exceeds about 1.3 V, the resistance memory element is switched from the high resistance state to the low resistance state (set). Accompanying this, the absolute value of the current abruptly increases, and the current-voltage characteristics transit from the point A to the point B. In FIG. 2, the current value at the point B is constantly about 20 mA because of the current limiter for preventing the element from breaking due to abrupt current increases.

As the voltage decreases gradually from the state at the point B, the current changes along the curve "b" in the arrowed direction, and its absolute value gradually decreases. When the applied voltage returns to 0 V, the current also becomes 0 A.

As the applied voltage again increases gradually from 0 V, the current changes along the curve "c" in the arrowed direction, and its absolute value gradually increases. When the applied positive voltage further increases and exceeds about 1.2 V, the resistance memory element is switched from the low resistance state to the high resistance state (reset). Accompanying this, the absolute value of the current abruptly decreases, and the current-voltage characteristics transits from the point C to the point D.

As the voltage is decreased gradually from the point D, the current changes in the arrowed direction along the curve "d", and the absolute value is gradually decreased. When the applied voltage returns to 0 V, the current also becomes 0 A.

The respective resistance states are stable not more than about 1.0 V and are retained when the electric power is turned off. That is, in the high resistance state, when the applied voltage is below the voltage at the point A, the current-voltage characteristics linearly change along the curve "a", and the high resistance state is retained. Similarly, in the low resistance state, when the applied voltage is below the voltage at the point C, the current-voltage characteristics change along the curve "c", and the low resistance state is retained.

As described above, in the resistance memory element using the unipolar resistance memory material, to change the resistance state between the high resistance state and the low resistance state, voltages of the same polarity are applied.

FIG. 3 logarithmically expresses the current axis of the current-voltage characteristics of FIG. 2. As shown, $TiO_x$, which is the typical unipolar resistance memory material, the resistance values at 0.5 V are different by about 3 places between the high resistance state and the low resistance state. Accordingly, for example, when the impedance in the high resistance state is matched with an outside circuit, the impedance matching with the outside circuit in the low resistance state largely breaks, and reversely, when the impedance in the low resistance state is matched with the outside circuit, the impedance matching with the outside circuit largely breaks for the high resistance state.

The resistance memory element formed of the above-described material cannot have the characteristics shown in FIGS. 1 and 2 in the initial state immediately after the element formation. To make the resistance memory material reversibly changeable between the high resistance state and the low resistance state, the processing called "forming" is necessary.

FIG. 4 shows the current-voltage characteristics explaining the forming process of the resistance memory element using the same unipolar resistance memory material as in FIGS. 2 and 3.

In the initial state immediately after the element has been formed, as shown in FIG. 4, the element is highly resistive and has a breakdown voltage of about 8 V which is very high. This breakdown voltage is very high in comparison with voltages necessary for the setting and resetting. In the initial state, changes of the resistance state, such as the setting and resetting, do not take place.

When a voltage higher than the breakdown voltage is applied in the initial state, as shown in FIG. 4, the value of the current flowing through the element abruptly increases, that is, the forming of the resistance memory element is made. Such forming is made, whereby the resistance memory element exhibits the current-voltage characteristics shown in FIG. 2 and can switch reversibly between the low resistance state and the high resistance state. Once subjected to the forming, the resistance memory element does not return to the initial state.

The resistance memory element in the initial state before subjected to the forming has a high resistance value, and this high resistance state might be misunderstood to be the high resistance state after the forming. Then, in the specification of the present application, the high resistance state means the high resistance state of the resistance memory element after subjected to the forming, the low resistance state means the low resistance state of the resistance memory element after subjected to the forming, and the initial state is the state of the resistance memory element before subjected to the forming.

The above-explanation has been made for the unipolar resistance memory material, but the explanation is the same with the bipolar resistance memory material.

Next, the structure of the nonvolatile semiconductor memory device according to the present embodiment will be explained with reference to FIGS. 5 and 6.

FIGS. 5 and 6 are circuit diagrams showing the structure of the nonvolatile semiconductor memory device according to the present embodiment.

As shown in FIG. 5, a memory cell 10 of the nonvolatile semiconductor memory device according to the present embodiment includes a resistance memory element 12 and a cell select transistor 14. The resistance memory element 12 has one end connected to a source line SL and the other end connected to the source terminal of the cell select transistor 14. The cell select transistor 14 has the drain terminal connected to a bit line BL and the gate terminal connected to a word line WL.

The resistance memory element 12 includes a resistance memory material sandwiched between a pair of electrodes. The resistance memory material may be a bipolar resistance memory material or a unipolar resistance memory material. In the present embodiment, the resistance memory material is a unipolar resistance material of, e.g. $TiO_x$.

Between the bit line BL and the source line SL, an impedance control transistor 16 is connected in parallel with the memory cell 10.

FIG. 6 is a circuit diagram of a memory cell array of the memory cells 10 shown in FIG. 5 arranged in a matrix. A plurality of memory cells 10 are formed adjacent to each other in the column direction (vertically in the drawing) and in the row direction (horizontally in the drawing).

In the column direction, a plurality of word lines WL1, WL2 . . . are arranged, forming signal lines common among the memory cells 10 arranged in the column direction.

In the row direction (horizontally in the drawing), a plurality of bit lines BL1, BL2, BL3, BL4 . . . are arranged, forming signal lines common among the memory cells 10 arranged in the row direction.

In the column direction, source lines SL1, SL2 . . . are also arranged, forming signal lines common among the memory cells 10 arranged in the column direction. The source lines SL are provided each for two bit lines BL.

Between each source line SL and two bit lines BL associated with the source line SL, the impedance control transistor 16 is provided. Thus, the impedance control transistor 16 is common among a plurality of the memory cells 10 arranged in the row direction.

Next, the method of writing into the nonvolatile semiconductor memory device according to the present embodiment shown in FIG. 6 will be explained with reference to FIGS. 7 and 8.

First, the rewriting operation from the high resistance state to the low resistance state, i.e., the setting operation will be explained with reference to FIG. 7. A memory cell 10 to be rewritten is a memory cell 10 connected to the word line WL1 and the bit line BL1.

First, a prescribed voltage is applied to the gate terminal of the impedance control transistor 16 to turn on the impedance control transistor 16 (see FIG. 7). At this time, the channel resistance $R_{IC}$ of the impedance control transistor 16 is controlled by the voltage applied to the gate terminal to thereby make an impedance as seen from the outside of the memory cell, i.e., an impedance between the bit line BL and the source line SL not more than a resistance value $R_L$ of the resistance memory element 12 in the low resistance state. The impedance as seen from the outside of the memory cell can be set not more than the resistance value $R_L$ of the resistance memory element 12 in the low resistance state by setting the channel resistance $R_{IC}$ of the impedance control transistor 16 not more than the resistance value $R_L$ of the resistance memory element 12 in the low resistance state.

To approximate the impedance of the memory cell with the resistance memory element 12 in the low resistance state to the impedance of the memory cell with the resistance memory element 12 in the high resistance state, it is preferable to control the channel resistance $R_{IC}$ of the impedance control transistor 16 to be much smaller than the resistance value $R_L$ of the resistance memory element 12 in the low resistance state, preferably not more than ½, more preferably not more than ⅕, further more preferably not more than 1/10.

Concurrently with turning on the impedance control transistor 16, a prescribed voltage is applied to the word line $WL_1$ to turn on the cell select transistor 14 (see FIG. 7). At this time, the voltage to be applied to the word line $WL_1$ is controlled so that the channel resistance $R_{CS}$ of the cell select transistor 14 is ignorably small in comparison with the resistance value $R_L$ of the resistance memory element 12 in the low resistance state.

The source line SL1 is connected to a reference potential, e.g., 0 V, which is the ground potential (see FIG. 7).

The applied voltages to the impedance control transistor 16 and to the cell select transistor 14 are thus set, whereby the channel resistance $R_{IC}$ of the impedance control transistor 16 is ignorably small in comparison with the resistance value $R_H$ of the resistance memory element, and the impedance between the bit line BL1 and the source line SL1 is $$R_H \times R_{IC}/(R_H+R_{IC}) \approx R_{IC}.$$

Then, a bias voltage which is equal to or a little higher than the voltage necessary to set the resistance memory element 12 is applied to the bit line BL1 (see FIG. 7). Thus, a current path to the source line SL1 via the bit line BL1, the resistance memory element 12 and the cell select transistor 14 is formed, and the applied bias voltage is divided to the resistance memory element 12 and the cell select transistor 14, corresponding to the resistance value $R_H$ of the resistance memory element 12 and the channel resistance $R_{CS}$ of the cell select transistor 14.

At this time, because of the resistance value $R_H$ of the resistance memory element 12, which is sufficiently large in comparison with the channel resistance $R_{CS}$ of the cell select transistor, most of the bias voltage is applied to the resistance memory element 12. Thus, the resistance memory element 12 is changed from the high resistance state to the low resistance state.

Then, the bias voltage to be applied to the bit line BL1 is returned to zero, and then the voltage to be applied to the gate terminal of the impedance control transistor 16 and the voltage to be applied to the word line WL1 are turned off. Thus, the setting operation is completed (see FIG. 7).

Next, the rewriting operation from the low resistance state to the high resistance state, i.e., the resetting operation will be explained with reference to FIG. 8. The memory cell 10 to be rewritten is a memory cell 10 connected to the word line WL1 and the bit line BL1.

First, a prescribed voltage is applied to the gate terminal of the impedance control transistor 16 to turn on the impedance control transistor 16 (see FIG. 8). At this time, the channel resistance $R_{IC}$ of the impedance control transistor 16 is controlled by the voltage applied to the gate terminal to thereby make an impedance as seen from the outside of the memory cell, i.e., an impedance between the bit line BL and the source line SL not more than a resistance value $R_L$ of the resistance memory element 12 in the low resistance state. The impedance as seen from the outside of the memory cell can be set not more than the resistance value $R_L$ of the resistance memory element 12 in the low resistance state by setting the channel resistance $R_{IC}$ of the impedance control transistor 16 not more than the resistance value $R_L$ of the resistance memory element 12 in the low resistance state.

To approximate the impedance of the memory cell with the resistance memory element 12 in the low resistance state to the impedance of the memory cell with the resistance memory element 12 in the high resistance state, it is preferable to control the channel resistance $R_{IC}$ of the impedance control transistor 16 to be much smaller than the resistance value $R_L$ of the resistance memory element 12 in the low resistance state, preferably not more than ½, more preferably not more than ⅕, further more preferably not more than 1/10.

Concurrently with turning on the impedance control transistor 16, a prescribed voltage is applied to the word line $WL_1$ to turn on the cell select transistor 14 (see FIG. 8). At this time, the voltage to be applied to the word line WL1 is controlled so that the channel resistance $R_{CS}$ of the cell select transistor 14 is ignorably small in comparison with the resistance value $R_L$ of the resistance memory element 12 in the low resistance state.

The source line SL1 is connected to a reference potential, e.g., 0 V, which is the ground potential (see FIG. 8).

The applied voltages to the impedance control transistor 16 and to the cell select transistor 14 are thus set, whereby the channel resistance $R_{IC}$ of the impedance control transistor 16 is ignorably small in comparison with the resistance value $R_L$ of the resistance memory element, and the impedance between the bit line BL1 and the source line SL1 is $$R_L \times R_{IC}/(R_L+R_{IC}) \approx R_{IC}.$$

That is, this impedance value is substantially equal to the impedance between the bit line BL1 and the source line SL1 when set.

Then, a bias voltage which is equal to or a little higher than the voltage necessary to reset the resistance memory element 12 is applied to the bit line BL1 (see FIG. 8). Thus, a current path to the source line SL1 via the bit line BL1, the resistance memory element 12 and the cell select transistor 14 is formed, and the applied bias voltage is divided to the resistance memory element 12 and the cell select transistor 14, corresponding to the resistance value $R_L$ of the resistance memory element 12 and the channel resistance $R_{CS}$ of the cell select transistor 14.

At this time, because of the channel resistance $R_{CS}$ of the cell select transistor 14 which is sufficiently smaller than the resistance value $R_L$ of the resistance memory element 12, most of the applied bias voltage is applied to the resistance memory element 12. Thus, the resistance memory element 12 is changed from the low resistance state to the high resistance state.

As described above, in the resetting processing, instantaneously with resetting the resistance memory element 12 to the high resistance state, substantially all the bias voltage is divided to the resistance memory element 12, and it is necessary to prevent the resistance memory element 12 from being again reset by this bias voltage. Accordingly, the bias voltage to be applied to the bit line BL is set to be less than a voltage necessary for setting.

That is, in the resetting process, the channel resistance $R_{CS}$ of the cell select transistor 14 is adjusted to be sufficiently smaller than the resistance value $R_L$ of the resistance memory element, and the bias voltage to be applied to the bit line BL is set to be not less than a voltage necessary for resetting and less than a voltage necessary for setting.

Then, the bias voltage to be applied to the bit line BL1 is returned to zero. Then, the voltage to be applied to the gate terminal of the impedance control transistor 16 and the voltage to be applied to the word line WL are turned off. Thus the resetting operation is completed (see FIG. 8).

In the nonvolatile semiconductor memory device according to the present embodiment, in the resetting operation described above, by concurrently driving a plurality of bit lines BL (e.g., BL1-BL4), a plurality memory cells 10 connected to the selected word line (e.g., WL1) can be reset at once.

Next, the method of reading the nonvolatile semiconductor memory device according to the present embodiment shown in FIG. 6 will be explained with reference to FIG. 9. A memory cell 10 to be read is the memory cell 10 connected to the word line WL1 and the bit line BL1.

First, a prescribed voltage is applied to the word line WL1 to turn on the cell select transistor 14 (see FIG. 9). At this time, the voltage to be applied to the word line WL1 is controlled so that a channel resistance $R_{CS}$ of the cell select transistor 14 is sufficiently smaller than a resistance value $R_L$ of the resistance memory element 12 in the low resistance state.

In the reading operation of the nonvolatile semiconductor memory device according to the present embodiment, the impedance control transistors 16 are not used. That is, the impedance control transistors 16 are turned off (see FIG. 9).

The source line SL1 is connected to a reference voltage, e.g., 0 V, which is the ground potential (see FIG. 9).

Then, to the bit line BL1, a prescribed bias voltage which does not cause the setting and the resetting is applied (see FIG. 9). When the resistance memory element 12 has the current-voltage characteristics of, e.g., FIG. 2, the bias voltage is set so that a voltage of not more than about 1.0 V is applied to the resistance memory element 12.

When such bias voltage is applied to the bit line BL, a current corresponding to the resistance value of the resistance memory element 12 flows in the bit line BL1. A value of the current flowing in the bit line BL1 is detected, whereby a resistance state of the resistance memory element 12 can be read.

As described above, according to the present embodiment, the impedance control transistor is provided, parallelly connected to the resistance memory element, and in a rewriting, the resistance value of the impedance control transistor is set sufficiently smaller than the resistance value of the resistance memory elements in the low resistance state, whereby the impedance as seen from the outside of the memory cell can be made substantially equal in a rewriting, irrespective of resistance states of the resistance memory elements. Thus, both when the memory cell is rewritten from the high resistance state to the low resistance state and when the memory cell is rewritten from the low resistance state to the high resistance state, the impedance matching between the peripheral circuit and the memory cell can be easily made.

A Second Embodiment

The nonvolatile semiconductor memory device, the method of writing into the same and the method of reading the same according to a second embodiment of the present invention will be explained. The same members of the present embodiment as those of the nonvolatile semiconductor memory device, the method of writing into the same and the method of reading the same according to the first embodiment shown in FIGS. 1 to 9 are represented by the same reference numbers not to repeat or to simplify their explanation.

The nonvolatile semiconductor memory device according to the present embodiment is the same as the nonvolatile semiconductor memory device according to the first embodiment shown in FIGS. 5 and 6 except that in the former, the resistance memory element 12 is formed of the bipolar resistance memory material. The bipolar resistance memory material can be, e.g., $SrZrO_3$ doped with Cr or others. To the resistance memory element of the nonvolatile semiconductor memory device according to the present embodiment, as shown in, e.g., FIG. 1, a negative bias voltage is applied in the setting, and, in the resetting, a positive bias voltage is applied.

Then, the method of writing into the nonvolatile semiconductor memory device according to the present embodiment will be explained. The method of writing into the nonvolatile semiconductor memory device according to the present embodiment is basically the same as the method of writing into the nonvolatile semiconductor memory device according to the first embodiment except that the polarity of the bias voltage.

First, the rewriting operation from the high resistance state to the low resistance state, i.e., the setting operation will be explained. A memory cell 10 to be rewritten is a memory cell 10 connected to the word line WL1 and the bit line BL1.

First, a prescribed voltage is applied to the gate terminal of the impedance control transistor 16 to turn on the impedance control transistor 16. At this time, the channel resistance $R_{IC}$ of the impedance control transistor 16 is controlled by the voltage applied to the gate terminal to thereby make an impedance as seen from the outside of the memory cell, i.e., an impedance between the bit line BL and the source line SL not more than a resistance value $R_L$ of the resistance memory element 12 in the low resistance state. The impedance as seen from the outside of the memory cell can be set not more than the resistance value $R_L$ of the resistance memory element 12 in the low resistance state by setting the channel resistance $R_{IC}$ of the impedance control transistor 16 not more than the resistance value $R_L$ of the resistance memory element 12 in the low resistance state.

To approximate the impedance of the memory cell with the resistance memory element 12 in the low resistance state to the impedance of the memory cell with the resistance memory element 12 in the high resistance state, it is preferable to control the channel resistance $R_{IC}$ of the impedance control transistor 16 to be much smaller than the resistance value $R_L$ of the resistance memory element 12 in the low resistance state, preferably not more than ½, more preferably not more than ⅕, further more preferably not more than 1/10.

Concurrently with turning on the impedance control transistor 16, a prescribed voltage is applied to the word line WL1 to turn on the cell select transistor 14. At this time, the voltage to be applied to the word line WL1 is controlled so that the channel resistance $R_{CS}$ of the cell select transistor 14 is ignorably small in comparison with the resistance value $R_L$ of the resistance memory element 12 in the low resistance state.

The source line SL1 is connected to a reference potential, e.g., 0 V, which is the ground potential.

The applied voltages to the impedance control transistor 16 and to the cell select transistor 14 are thus set, whereby the channel resistance $R_{IC}$ of the impedance control transistor 16 is ignorably small in comparison with the resistance value $R_H$ of the resistance memory element, and the impedance between the bit line BL1 and the source line SL1 is $$R_H \times R_{IC}/(R_H+R_{IC}) \approx R_{IC}.$$

Then, to the bit line BL1, a negative bias voltage which is the same as a voltage necessary to set the resistance memory element 12 or whose absolute value is a little larger than the voltage is applied. Thus, a current path to the source line SL1 via the bit line BL1, the resistance memory element 12 and the cell select transistor 14 is formed, and the applied bias voltage is divided to resistance memory element 12 and the cell select transistor 14, corresponding to the resistance value $R_H$ of the resistance memory element 12 and the channel resistance $R_{CS}$ of the cell select transistor 14.

At this time, because of the resistance value $R_H$ of the resistance memory element 12, which is sufficiently large in comparison with the channel resistance $R_{CS}$ of the cell select transistor, most of the bias voltage is applied to the resistance memory element 12. Thus, the resistance memory element 12 is changed from the high resistance state to the low resistance state.

Then, the bias voltage to be applied to the bit line BL1 is returned to zero, and then the voltage to be applied to the gate terminal of the impedance control transistor 16 and the voltage to be applied to the word line WL1 are turned off. Thus, the setting operation is completed.

Next, the rewriting operation from the low resistance state to the high resistance state, i.e., the resetting operation will be explained. The memory cell 10 to be written is a memory cell 10 connected to the word line WL1 and the bit line BL1.

First, a prescribed voltage is applied to the gate terminal of the impedance control transistor 16 to turn on the impedance control transistor 16. At this time, the channel resistance $R_{IC}$ of the impedance control transistor 16 is controlled by the voltage applied to the gate terminal to thereby make an impedance as seen from the outside of the memory cell, i.e., an impedance between the bit line BL and the source line SL not more than a resistance value $R_L$ of the resistance memory element 12 in the low resistance state. The impedance as seen from the outside of the memory cell can be set not more than the resistance value $R_L$ of the resistance memory element 12 in the low resistance state by setting the channel resistance $R_{IC}$ of the impedance control transistor 16 not more than the resistance value $R_L$ of the resistance memory element 12 in the low resistance state.

To approximate the impedance of the memory cell with the resistance memory element 12 in the low resistance state to the impedance of the memory cell with the resistance memory element 12 in the high resistance state, it is preferable to control the channel resistance $R_{IC}$ of the impedance control transistor 16 to be much smaller than the resistance value $R_L$ of the resistance memory element 12 in the low resistance state, preferably not more than ½, more preferably not more than ⅕, further more preferably not more than 1/10.

Concurrently with turning on the impedance control transistor 16, a prescribed voltage is applied to the word line WL1 to turn on the cell select transistor 14. At this time, the voltage to be applied to the word line WL1 is controlled so that the channel resistance $R_{CS}$ of the cell select transistor 14 is ignorably small in comparison with the resistance value $R_L$ of the resistance memory element 12 in the low resistance state.

The source line SL1 is connected to a reference potential, e.g., 0 V, which is the ground potential.

The applied voltages to the impedance control transistor 16 and to the cell select transistor 14 are thus set, whereby the channel resistance $R_{IC}$ of the impedance control transistor 16 is ignorably small in comparison with the resistance value $R_L$ of the resistance memory element, and the impedance between the bit line BL1 and the source line SL1 is $$R_L \times R_{IC}/(R_L+R_{IC}) \approx R_{IC}.$$

That is, this impedance value is substantially equal to the impedance between the bit line BL1 and the source line SL1 when set.

Then, to the bit line BL1, a positive bias voltage which is the same as a voltage necessary to reset the resistance memory element 12 or whose absolute value is a little larger than the voltage is applied. Thus, a current path to the source line SL1 via the bit line BL1, the resistance memory element 12 and the cell select transistor 14 is formed, and the applied bias voltage is divided to the resistance memory element 12 and the cell select transistor 14, corresponding to the resistance value $R_L$ of the resistance memory element 12 and the channel resistance $R_{CS}$ of the cell select transistor 14.

At this time, because of the channel resistance $R_{CS}$ of the cell select transistor 14 which is sufficiently smaller than the resistance value $R_L$ of the resistance memory element 12, most of the applied bias voltage is applied to the resistance memory element 12. Thus, the resistance memory element 12 is changed from the low resistance state to the high resistance state.

In the case that the bipolar resistance memory material is used, the polarity of the voltage necessary for the setting and the polarity of the voltage necessary for the resetting are different from each other, a set value of the voltage to be applied in the resetting process can be decided independently of a set value of the voltage to be applied in the setting process.

Next, the bias voltage to be applied to the bit line BL1 is returned to zero, and then the voltage to be applied to the gate terminal of the impedance control transistor 16 and the voltage to be applied to the word line WL are turned off. Thus, the resetting operation is completed.

In the nonvolatile semiconductor memory device according to the present embodiment, in the resetting operation described above, by concurrently driving a plurality of bit lines BL (e.g., BL1-BL4), a plurality of the memory cells 10 connected to a selected word line (e.g., WL1) can be reset at once.

Next, the method of reading the nonvolatile semiconductor memory device according to the present embodiment will be explained. A memory cell 10 to be read is the memory cell 10 connected to the word line WL1 and the bit line BL1.

First, a prescribed voltage is applied to the word line WL1 to turn on the cell select transistor 14. At this time, the voltage to be applied to the word line WL1 is controlled so that a channel resistance $R_{CS}$ of the cell select transistor 14 is sufficiently smaller than a resistance value $R_L$ of the resistance memory element 12 in the low resistance state.

In the reading operation of the nonvolatile semiconductor memory device according to the present embodiment, the impedance control transistor 16 is not used. That is, the impedance control transistor 16 is turned off.

The source line SL1 is connected to a reference voltage, e.g., 0 V, which is the ground potential.

Then, to the bit line BL1, a prescribed bias voltage which does not cause the setting and the resetting is applied. When the resistance memory element 12 has the current-voltage characteristics of, e.g., FIG. 2, the bias voltage is set so that a voltage of not more than about 1.0 V is applied to the resistance memory element 12.

When such bias voltage is applied to the bit line BL1, a current corresponding to the resistance value of the resistance memory element 12 flows in the bit line BL1. A value of the current flowing in the bit line BL1 is detected, whereby a resistance state of the resistance memory element 12 can be read.

As described above, according to the present embodiment, the impedance control transistor is provided, parallelly connected to the resistance memory element, and in a rewriting, the resistance value of the impedance control transistor is sufficiently smaller than the resistance value of the resistance memory elements in the low resistance state, whereby the impedance as seen from the outside of the memory cell can be made substantially equal in a rewriting, irrespective of resistances states of the resistance memory element. Thus, both when the memory cell is rewritten from the high resistance state to the low resistance and when the memory cells are rewritten from the low resistance state to the high resistance state, the impedance matching can be made between the peripheral circuit and the memory cell.

A Third Embodiment

The nonvolatile semiconductor memory device, a method of writing into the same and the method of reading the same according to a third embodiment of the present invention will be explained with reference to FIGS. 10 and 11. The same members of the present embodiment as those of the nonvolatile semiconductor memory device, a method of writing into the same and the method of reading the same according to the first embodiment shown in FIGS. 1 to 9 are represented by the same reference numbers not to repeat or to simplify their explanation.

Figure 10:
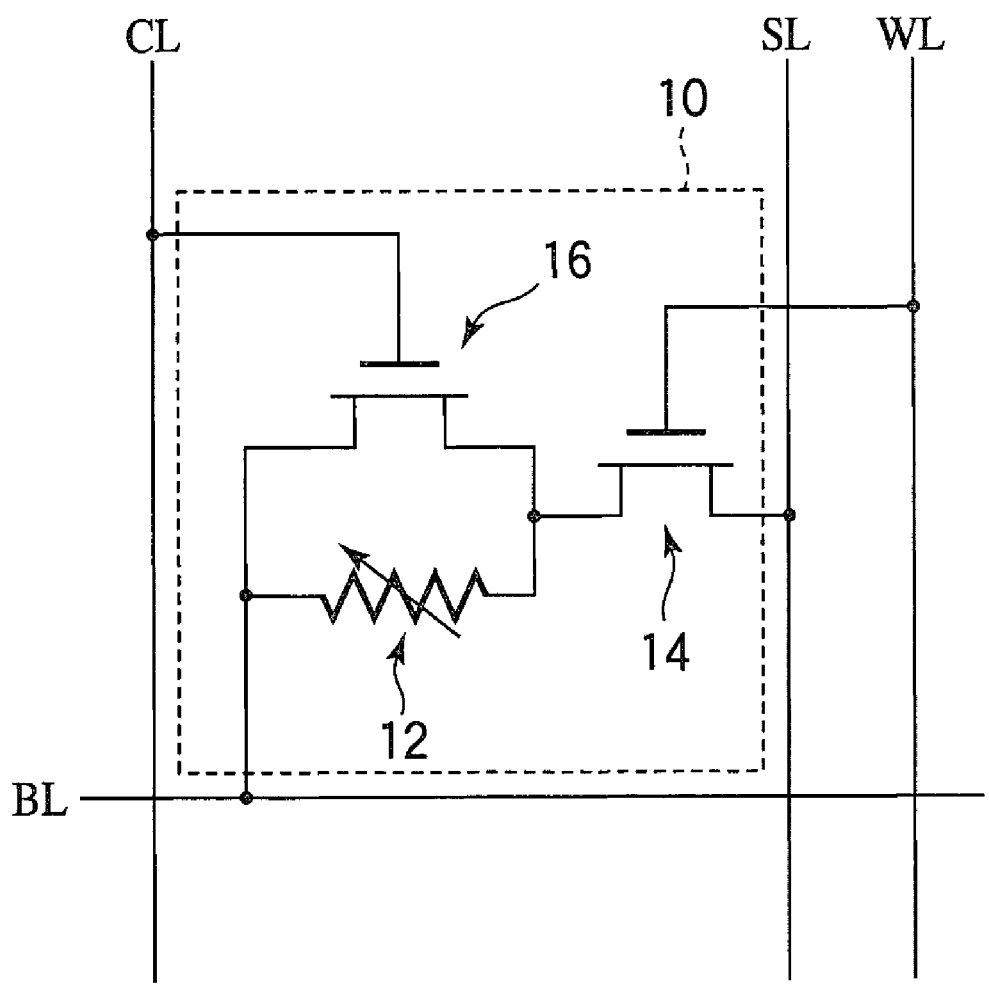
FIGS. 10 and 11 are circuit diagrams showing the structure of the nonvolatile semiconductor memory device according to a third embodiment of the present invention.
Figure 11:
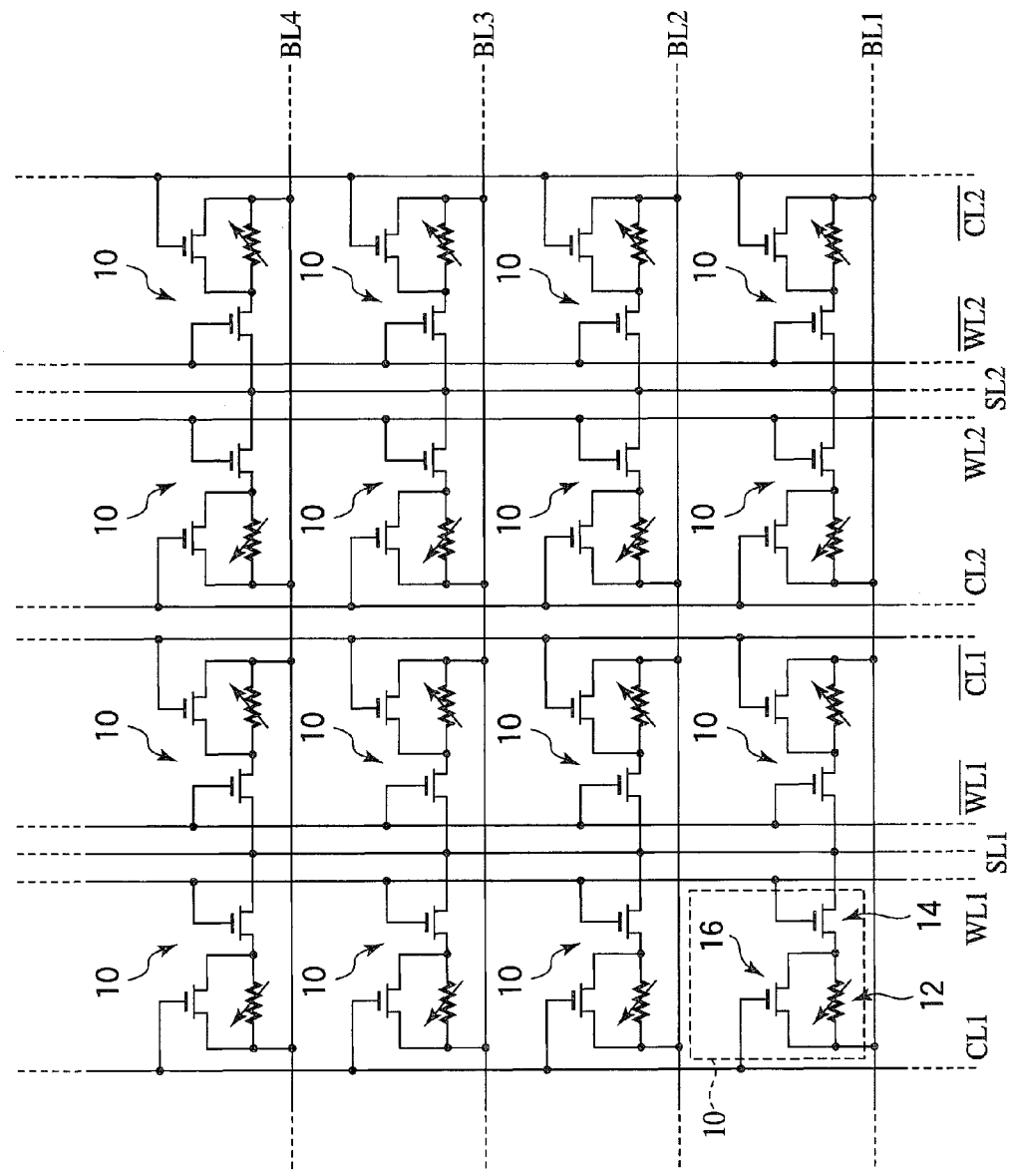

FIGS. 10 and 11 are circuit diagrams showing the structure of the nonvolatile semiconductor memory device according to the present embodiment.

First, the structure of the nonvolatile semiconductor memory device according to the present embodiment will be explained with reference to FIGS. 10 and 11.

A memory cell 10 of the nonvolatile semiconductor memory device according to the present embodiment includes, as shown in FIG. 10, a resistance memory element 12, a cell select transistor 14 and an impedance control transistor 16. The resistance memory element 12 and the impedance control transistor 16 are parallelly connected, and this parallelly connected set has one end connect to the bit line BL and the other end connected to the drain terminal of the cell select transistor 14. The cell select transistor 14 has the source terminal connected to the source line SL and the gate terminal connected to the word line WL. The impedance control transistor 16 has the gate terminal connected to the control line CL.

The resistance memory element 12 includes a resistance memory material sandwiched between a pair of electrodes. The resistance memory material may be either of the bipolar resistance memory material and the unipolar resistance memory material. In the present embodiment, the resistance memory material is, e.g., the unipolar resistance memory material of, e.g., $TiO_x$.

FIG. 11 is a circuit diagram of the memory cell array of the memory cells 10 shown in FIG. 10 arranged in a matrix. The memory cells 10 are formed adjacent to each other in the column direction (vertically in the drawing) and the row direction (horizontally in the drawing).

In the column direction, a plurality of word lines WL1, /WL1, WL2, /WL2 . . . , control lines CL1, /CL1, CL2, /CL2 . . . and source lines SL1, SL2 . . . are arranged to respectively form signal lines common among the memory cells 10 arranged in the row direction. The source lines SL are provided each for two word lines WL.

A plurality of bit lines BL1, BL2, BL3, BL4 . . . are arranged in the row direction (horizontally in the drawing) to form signal lines common among the memory cells 10 arrange din the row direction.

Next, the method of writing into the nonvolatile semiconductor memory device according to the present embodiment shown in FIG. 11 will be explained with reference to FIGS. 7 and 8.

First, the rewriting operation from the high resistance state to the low resistance state, i.e., the setting operation will be explained with reference to FIG. 7. A memory cell to be rewritten is the memory cell 10 connected to the word line WL1 and the bit line BL1.

First, a prescribed voltage is applied to the control line CL1 to turn on the impedance control transistor 16 (see FIG. 7). At this time, the channel resistance $R_{IC}$ of the impedance control transistor 16 is controlled by the voltage applied to the control line CL1 to thereby make an impedance as seen from the outside of the memory cell, i.e., an impedance between the bit line BL and the source line SL not more than a resistance value $R_L$ of the resistance memory element 12 in the low resistance state.

Concurrently with turning on the impedance control transistor 16, a prescribed voltage is applied to the word line WL1 to turn on the cell select transistor 14 (see FIG. 7). At this time, the voltage to be applied to the word line WL1 is controlled to be a value which is ignorably small in comparison with a synthetic resistance $(R_H \times R_{IC}/(R_H+R_{IC}))$ of a resistance value $R_H$ of the resistance memory element 12 in the high resistance and a channel resistance $R_{IC}$ of the impedance control transistor 16.

At this time the impedance as seen from the outside of the memory cell can be set substantially not more than the resistance value $R_L$ of the resistance memory element 12 in the low resistance state by setting the channel resistance $R_{IC}$ of the impedance control transistor 16 not more than the resistance value $R_L$ of the resistance memory element 12 in the low resistance state.

To approximate the impedance of the memory cell with the resistance memory element 12 in the low resistance state to the impedance of the memory cell with the resistance memory element 12 in the high resistance state, it is preferable to control the channel resistance $R_{IC}$ of the impedance control transistor 16 to be much smaller than the resistance value $R_L$ of the resistance memory element 12 in the low resistance state, preferably not more than ½, more preferably not more than ⅕, further more preferably not more than 1/10.

The source line SL1 is connected to a reference potential, e.g., 0 V, which is the ground potential (see FIG. 7).

The voltage to be applied to the impedance control transistor 16 and the cell select transistor 14 are so set, whereby the channel resistance $R_{IC}$ of the impedance control transistor 16 is ignorably small in comparison with the resistance value $R_H$ of the resistance memory element 12, and the resistance value $R_{CS}$ of the cell select transistor 14 is ignorably small in comparison with the synthetic resistance $(R_H \times R_{IC}/(R_H+R_{IC}))$ of the resistance value $R_H$ of the resistance memory element 12 and the channel resistance $R_{IC}$ of the impedance control transistor 16, and the impedance between the bit line BL1 and source line SL1 is $$[R_H \times R_{IC}/(R_H+R_{IC})] + R_{CS} \approx R_{IC}.$$

Then, a bias voltage which is the same as or a little higher than the voltage necessary to set the resistance memory element 12 is applied to the bit line BL1 (see FIG. 7). Thus, a current path to the source line SL1 via the bit line BL1, the resistance memory element 12 and the cell select transistor 14 is formed, and the applied bias voltage is divided to the resistance memory element 12 and the cell select transistor 14 respectively corresponding to the synthetic resistance $(R_H \times R_{IC}/(R_H+R_{IC}))$ of the resistance value $R_H$ of the resistance memory element 12 and the channel resistance $R_{IC}$ of the impedance control transistor 16, and the channel resistance $R_{CS}$ of the cell select transistor 14.

At this time, because of the synthetic resistance $(R_H \times R_{IC}/(R_H+R_{IC}))$ of the resistance value $R_H$ of the resistance memory element 12 and the channel resistance $R_{IC}$ of the impedance control transistor 16, which is sufficiently large in comparison with the resistance $R_{CS}$ of the cell select transistor 14, most of the bias voltage is applied to the resistance memory element 12. Thus, the resistance memory element 12 is changed from the high resistance state to the lower resistance state.

Then, the bias voltage to be applied to the bit line BL1 is returned to zero, and then the voltage to be applied to the control line CL1 and the voltage to be applied to the word line WL1 are turned off. Thus, the setting operation is completed (see FIG. 7).

Then, the rewriting operation from the low resistance state to the high resistance state, i.e., the resetting operation will be explained with reference to FIG. 8. A memory cell to be rewritten is the memory cell 10 connected to the word line WL1 and the bit line BL1.

First, a prescribed voltage is applied to the control line CL1 to turn on the impedance control transistor 16 (see FIG. 8). At this time, the channel resistance $R_{IC}$ of the impedance control transistor 16 is controlled by the voltage applied to the control line CL1 to thereby make the impedance as seen from the outside of the memory cell, i.e., the impedance between the bit line BL and the source line SL not more than the resistance value $R_L$ of the resistance memory element 12 in the low resistance state.

Concurrently with turning on the impedance control transistor 16, a prescribed voltage is applied to the word line WL1 to turn on the cell select transistor 14 (see FIG. 8). At this time, the voltage to be applied to the word line WL1 is controlled so that the channel resistance $R_{CS}$ of the cell select transistor 14 is ignorably small in comparison with the synthetic resistance $(R_L \times R_{IC}/(R_L+R_{IC}))$ of the resistance value $R_L$ of the resistance memory element 12 in the low resistance state and the channel resistance $R_{IC}$ of the impedance control transistor 16.

At this time, the impedance as seen from the outside of the memory cell can be set substantially not more than the resistance value $R_L$ of the resistance memory element 12 in the low resistance state by setting the channel resistance of the impedance control transistor 16 not more than the resistance value $R_L$ of the resistance memory element 12 in the low resistance state.

To approximate the impedance of the memory cell with the resistance memory element 12 in the low resistance state to the impedance of the memory cell with the resistance memory element 12 in the high resistance state, preferably, the channel resistance $R_{IC}$ of the impedance control transistor 16 is controlled to be sufficiently smaller than the resistance value $R_L$ of the resistance memory element 12 in the low resistance state, preferably not more than ½, more preferably not more than ⅕ and further more preferably not more than 1/10.

The source line SL1 is connected to a reference potential, e.g., 0 V, which is the ground potential (see FIG. 8).

The applied voltage to the impedance control transistor 16 and the cell select transistor 14 are thus set, whereby the channel resistance $R_{IC}$ of the impedance control transistor 16 is ignorably small in comparison with the resistance value $R_L$ of the resistance memory element 12, and the channel resistance $R_{CS}$ of the cell select transistor 14 is ignorably small in comparison with the synthetic resistance $(R_L \times R_{IC}/(R_L+R_{IC}))$ of the resistance value $R_L$ of the resistance memory element 12 and the channel resistance $R_{IC}$ of the impedance control transistor 16, and the impedance between the bit line BL1 and the source line SL1 is $$[R_L \times R_{IC}/(R_L+R_{IC})] + R_{CS} \approx R_{IC}.$$

That is, this impedance value is substantially equal to the impedance between the bit line BL1 and the source SL1 when set.

Then, a bias voltage which is the same or a little higher than the voltage necessary to set the resistance memory element 12 is applied to the bit line BL1 (see FIG. 8). Thus, a current path to the source line SL1 via the bit line BL1, the resistance memory element 12 and the cell select transistor 14 is formed, and the applied bias voltage is divided to the resistance memory element 12 and the cell select transistor 14 respectively corresponding to the synthetic resistance $(R_L \times R_{IC}/(R_L+R_{IC}))$ of the resistance value $R_L$ of the resistance memory element 12 and the channel resistance $R_{IC}$ of the impedance control transistor 16, and the channel resistance $R_{CS}$ of the cell select transistor 14.

At this time, because of the channel resistance $R_{IC}$ of the cell select transistor 14 which is sufficiently smaller than the synthetic resistance $(R_L \times R_{IC}/(R_L+R_{IC}))$ of the resistance value $R_L$ of the resistance memory element 12 and the channel resistance $R_{IC}$ of the impedance control transistor 16, most the applied bias voltage is applied to the resistance memory element 12. Thus, the resistance memory element 12 is changed from the low resistance state to the high resistance state.

In the resetting process, as described above, at the instance when the resistance memory element 12 has been changed to the high resistance state, almost all the bias voltage is divided to the resistance memory element 12. Accordingly, it is necessary to prevent the resistance memory element 12 from being reset by this bias voltage. To this end, the bias voltage to be applied to the bit line BL must be smaller than the voltage necessary for the setting.

That is, in the resetting process, the channel resistance $R_{CS}$ of the cell select transistor 14 is adjusted to be sufficiently smaller than the synthetic resistance $(R_L \times R_{IC}/(R_L+R_{IC}))$ of the resistance value $R_L$ of the resistance memory element 12 and the channel resistance $R_{IC}$ of the impedance control transistor 16 while the bias voltage to be applied to the bit line BL is set to be not less than the voltage necessary for the resetting and less than the voltage necessary for the setting.

Then, the bias voltage to be applied to the bit line BL1 is returned to zero, and then the voltage to be applied to the control line CL1 and the voltage to be applied to the word line WL1 are turned off. Thus, the resetting operation is completed (see FIG. 8B.

In the nonvolatile semiconductor memory device according to the present embodiment, a plurality of bit lines BL (e.g., BL1-BL4) are concurrently driven in the resetting operation described above, whereby a plurality of memory cells 10 connected to the selected word line (e.g., WL1) can be reset at once.

Next, the method of reading the nonvolatile semiconductor memory device according to the present embodiment shown in FIG. 11 will be explained with reference to FIG. 9. A memory cell 10 to be read is the memory cell 10 connected to the word line WL1 and the bit line BL1.

First, a prescribed voltage is applied to the word line WL1 to turn on the cell select transistor 14 (see FIG. 9). At this time, the voltage to be applied to the word line WL1 is controlled so that the channel resistance $R_{CS}$ of the cell select transistor 14 is sufficiently smaller than the resistance value $R_L$ of the resistance memory element 12 in the low resistance state.

The impedance control transistor 16 is not used in the reading operation of the nonvolatile semiconductor memory device according to the present embodiment. That is, the impedance control transistor 16 is off (see FIG. 9).

The source line SL1 is connected to a reference potential, e.g., 0 V, which is the ground potential (see FIG. 8).

Then, a prescribed bias voltage which does not cause the setting and the resetting is applied to the bit line BL1 (see FIG. 9). When the resistance memory element 12 has, e.g., the current-voltage characteristics shown in FIG. 2, the bias voltage is set so that a voltage not more than about 1.0 V is applied to the resistance memory element 12.

When the bias voltage is applied to the bit line BL1, current corresponding to the resistance memory element 12 flows in the bit line BL1. Accordingly, the value of the current flowing in the bit line BL1 is detected, whereby the resistance state of the resistance memory element 12 can be read.

As described above, according to the present embodiment, the impedance control transistor is provided, parallelly connected to the resistance memory element, and in the rewriting, the resistance value of the impedance control transistor is made sufficiently smaller than the resistance value of the resistance memory elements in the low resistance, whereby irrespective of the resistance state of the resistance memory elements, the impedance as seen from the outside of the memory cell in the rewriting can be made substantially equal. Thus, both when the memory cell is rewritten from the high resistance state to the low resistance state and when the memory cell is rewritten from the low resistance state to the high resistance state, the impedance matching can be made between the peripheral circuit and the memory cell.

A Fourth Embodiment

The nonvolatile semiconductor memory device, the method of writing into the same and the method of reading the same according to a fourth embodiment of the present invention will be explained. The same members of the present embodiment as those of the nonvolatile semiconductor memory device the method of writing into the same and the method of reading the same according to the third embodiment are represented by the same reference numbers not to repeat or to simplify their explanation.

The nonvolatile semiconductor memory device according to the present embodiment is the same as the nonvolatile semiconductor memory device according to the third embodiment shown in FIGS. 10 and 11 except that in the former, the resistance memory element 12 is formed of the bipolar resistance memory material. The bipolar resistance memory material can be, e.g., Cr-doped $SrZrO_3$, etc. In the resistance memory element of the nonvolatile semiconductor memory device according to the present embodiment, as shown in, e.g., FIG. 1, a negative bias voltage is applied in the setting, and in the resetting, a positive bias voltage is applied.

Next, the method of writing into the nonvolatile semiconductor memory device according to the present embodiment will be explained. The method of writing into the nonvolatile semiconductor memory device according to the present embodiment is basically the same as the method of writing into the nonvolatile semiconductor memory device according to the first embodiment except the polarity of the bias voltage.

First, the rewriting operation from the high resistance state to the low resistance state, i.e., the setting operation will be explained. A memory cell 10 to be rewritten is the memory cell 10 connected to the word line WL1 and the bit line BL1.

First, a prescribed voltage is applied to the control line CL1 to turn on the impedance control transistor 16. At this time, the channel resistance $R_{IC}$ of the impedance control transistor 16 is controlled by the voltage applied to the control line CL1 to thereby make an impedance as seen from the outside of the memory cell, i.e., an impedance between the bit line BL and the source line SL not more than a resistance value $R_L$ of the resistance memory element 12 in the low resistance state.

Concurrently with turning on the impedance control transistor 16, a prescribed voltage is applied to the word line WL1 to turn on the cell select transistor 14. At this time, the voltage to be applied to the word line WL1 is controlled so that the channel resistance $R_{CS}$ of the cell select transistor 14 is ignorably small in comparison with the synthetic resistance ($R_H \times R_{IC}/(R_H+R_{IC})$) of the resistance value $R_H$ of the resistance memory element 12 in the high resistance state and the channel resistance $R_{IC}$ of the impedance control transistor 16.

At this time, the impedance as seen from the outside of the memory cell can be set substantially not more than the resistance value $R_L$ of the memory cell element 12 in the low resistance state by setting the channel resistance $R_{IC}$ of the impedance control transistor 16 not more than the resistance value $R_L$ of the resistance memory element 12 in the low resistance state.

To approximate the impedance of the memory cell with the resistance memory element 12 in the low resistance state to the impedance of the memory cell with the resistance memory element 12 in the high resistance state, preferably, the channel resistance $R_{IC}$ of the impedance control transistor 16 is controlled to be sufficiently smaller than the resistance value $R_L$ of the resistance memory element 12 in the low resistance state, preferably not more than ½, more preferably not more than ⅕ and further more preferably not more than 1/10.

The source line SL1 is connected to a reference potential, e.g., 0 V, which is the ground potential.

The voltages to be applied to the impedance control transistor 16 and the cell select transistor 14 are so set, whereby the channel resistance $R_{IC}$ of the impedance control transistor 16 is ignorably small in comparison with the resistance value $R_H$ of the resistance memory element 12, and the resistance value $R_{CS}$ of the cell select transistor 14 is ignorably small in comparison with the synthetic resistance ($R_H \times R_{IC}/(R_H+R_{IC})$) of the resistance value $R_H$ of the resistance memory element 12 and the channel resistance $R_{IC}$ of the impedance control transistor 16, and the impedance between the bit line BL1 and source line SL1 is $$[R_H \times R_{IC}/(R_H+R_{IC})]+R_{CS} \approx R_{IC}.$$

Then, to the bit line BL1, a negative bias voltage which is the same as a voltage necessary to set the resistance memory element 12 or whose absolute value is a little larger than the voltage is applied. Thus, a current path to the source line SL1 via the bit line BL1, the resistance memory element 12 and the cell select transistor 14 is formed, and the applied bias voltage is divided to the resistance memory element 12 and the cell select transistor 14 respectively corresponding to the synthetic resistance $(R_H \times R_{IC}/(R_H+R_{IC}))$ of the resistance value $R_H$ of the resistance memory element 12 and the channel resistance $R_{IC}$ of the impedance control transistor 16, and the channel resistance $R_{CS}$ of the cell select transistor 14.

At this time, because of the synthetic resistance $(R_H \times R_{IC}/(R_H+R_{IC}))$ of the resistance value $R_H$ of the resistance memory element 12 and the channel resistance $R_{IC}$ of the impedance control transistor 16 which is sufficiently large in comparison with the channel resistance $R_{CS}$ of the cell select transistor 14, most of the bias voltage is applied to the resistance memory element 12. Thus, the resistance memory element 12 is changed from the high resistance state to the low resistance state.

Next, the bias voltage to be applied to the bit line BL1 is returned to zero, and then the voltage to be applied to the control line CL1 and the voltage to be applied to the word line WL1 are turned off, and the setting operation is completed.

Then, the rewriting operation from the low resistance state to the high resistance state, i.e., the resetting operation will be explained. A memory cell to be rewritten is the memory cell connected to the word line WL1 and the bit line BL1.

First, a prescribed voltage is applied to the control line CL1 to turn on the impedance control transistor 16. At this time, the channel resistance $R_{IC}$ of the impedance control transistor 16 is controlled by the voltage applied to the control line CL1, whereby the impedance as seen from the outside of the memory cell, i.e., the impedance between the bit line BL and the source line SL is not more than the resistance value $R_L$ of the resistance memory element 12 in the low resistance state.

Concurrently with turning on the impedance control transistor 16, a prescribed voltage is applied to the word line WL1 to turn on the cell select transistor 14. At this time, the voltage to be applied to the word line WL1 is controlled so that the channel resistance $R_{CS}$ of the cell select transistor 14 is ignorably small in comparison with the synthetic resistance $(R_L \times R_{IC}/(R_L+R_{IC}))$ of the resistance value $R_L$ of the resistance memory element 12 in the low resistance state and the channel resistance $R_{IC}$ of the impedance control transistor 16.

At this time, the impedance as seen from the outside of the memory cell can be set substantially not more than the resistance value $R_L$ of the resistance memory element 12 in the low resistance state by setting the channel resistance $R_{IC}$ of the resistance memory element 12 not more than the resistance value $R_L$ of the resistance memory element 12 in the low resistance state.

To approximate the impedance of the memory cell with the resistance memory element 12 in the low resistance state to the impedance of the memory cell of the resistance memory element 12 in the high resistance state, preferably, the channel resistance $R_{IC}$ of the impedance control transistor 16 is controlled to be sufficiently smaller than the resistance value $R_L$ of the resistance memory element 12 in the low resistance state, preferably not more than ½, more preferably not more than ⅕ and further more preferably not more than 1/10.

The source line SL1 is connected to a reference potential, e.g., 0 V, which is the ground potential.

The applied voltages to the impedance control transistor 16 and the cell select transistor 14 are thus set, whereby the channel resistance $R_{IC}$ of the impedance control transistor 16 is ignorably small in comparison with the resistance value $R_L$ of the resistance memory element 12, and the channel resistance $R_{CS}$ of the cell select transistor 14 is ignorably small in comparison with the synthetic resistance $(R_L \times R_{IC}/(R_L+R_{IC}))$ of the resistance value $R_L$ of the resistance memory element 12 and the channel resistance $R_{IC}$ of cell select transistor 16, and the impedance between the bit line BL1 and the source line SL1 is $$[R_L \times R_{IC}/(R_L+R_{IC})]+R_{CS} \approx R_{IC}.$$

That is, this impedance value is substantially equal to the impedance between the bit line BL1 and the source line SL1 when set.

Then, to the bit line BL1, a positive bias voltage which is the same as a voltage necessary for resetting the resistance memory element 12 or whose absolute value is a little larger than the voltage is applied. Thus, a current path to the source line SL1 via the bit line BL1, the resistance memory element 12 and the cell select transistor 14 is formed, and the applied voltage is divided to the resistance memory element 12 and the cell select transistor 14 respectively corresponding to the synthetic resistance $(R_L \times R_{IC}/(R_L+R_{IC}))$ of the resistance value $R_L$ of the resistance memory element 12 and the channel resistance $R_{IC}$ of the impedance control transistor 16, and the channel resistance $R_{CS}$ of the cell select transistor 14.

At this time, because of the channel resistance $R_{CS}$ of the cell select transistor 14 which is sufficiently smaller than the resistance value $R_L$ of the resistance memory element 12, most of the applied bias voltage is applied to the resistance memory element 12. Thus, the resistance memory element 12 is changed form the low resistance state to the high resistance state.

In the case that the bipolar resistance memory material is used, the polarity of the voltage necessary for the setting and the polarity of the voltage necessary for the resetting are different from each other, which allows the set value of the voltage to be applied in the resetting process can be set independent of the set value of the voltage to be applied in the setting process.

Then, the bias voltage to be applied to the bit line BL1 is returned to zero, and then the voltage to be applied to the control line CL1 and the voltage to be applied to the word line WL1 are turned off. Thus, the resetting operation is completed.

In the nonvolatile semiconductor memory device according to the present embodiment, in the resetting operation described above, a plurality of bit lines BL (e.g., BL1-BL4) are concurrently driven, whereby a plurality of memory cells connected to the selected word line (e.g., WL1) can be reset at once.

Next, the method of reading the nonvolatile semiconductor memory device according to the present embodiment will be explained. A memory cell 10 to be read is the memory cell 10 connected to the word line WL1 and the bit line BL1.

First, a prescribed voltage is applied to the word line WL1 to turn on the cell select transistor 14. At this time, the voltage to be applied to the word line WL1 is controlled so that the channel resistance $R_{CS}$ of the cell select transistor 14 is sufficiently smaller than the resistance value $R_L$ of the resistance memory element 12 in the low resistance state.

In the reading operation of the nonvolatile semiconductor memory device according to the present embodiment, the impedance control transistor 16 is not used. That is, the impedance control transistor 16 is turned off.

The source line SL1 is connected to a reference potential, i.e., 0 V, which is the ground potential.

Next, to the bit line BL1, a prescribed bias voltage which causes neither the setting nor the resetting is applied. In the case that the resistance memory element 12 has the current-voltage characteristics shown in, e.g., FIG. 2, the bias voltage is set so that a voltage of not more than about 1.0 V is applied to the resistance memory element 12.

When such bias voltage is applied to the bit line BL1, current corresponding to the resistance value of the resistance memory element 12 flows in the bit line BL1. Accordingly, the value of the current flowing in the bit line BL1 is detected, whereby the resistance state of the resistance memory element 12 can be read.

As described above, according to the present embodiment, the impedance control transistor is provided, parallelly connected to the resistance memory element, and in the resetting, the resistance value of the impedance control transistor is made sufficiently smaller than the resistance value of the resistance memory elements in the low resistance state, whereby independently of the resistance state of the resistance memory element, in the rewriting, the impedance as seen from the outside of the memory cell can be made substantially the same. Thus, both when the memory cell is rewritten from the high resistance state to the low resistance state and when the memory cell is rewritten from the low resistance state to the high resistance state, the impedance matching can be easily made between the peripheral circuit and the memory cell.

A Fifth Embodiment

The nonvolatile semiconductor memory device, the method of writing into the same and the method of reading the same according to a fifth embodiment of the present invention will be explained with reference to FIG. 12. The same members of the present embodiment as those of the nonvolatile semiconductor memory device, the method of writing into the same and the method of reading the same according to the first to the fourth embodiments shown in FIGS. 1 to 11 are represented by the same reference numbers not to repeat or to simplify their explanation.

Figure 12:
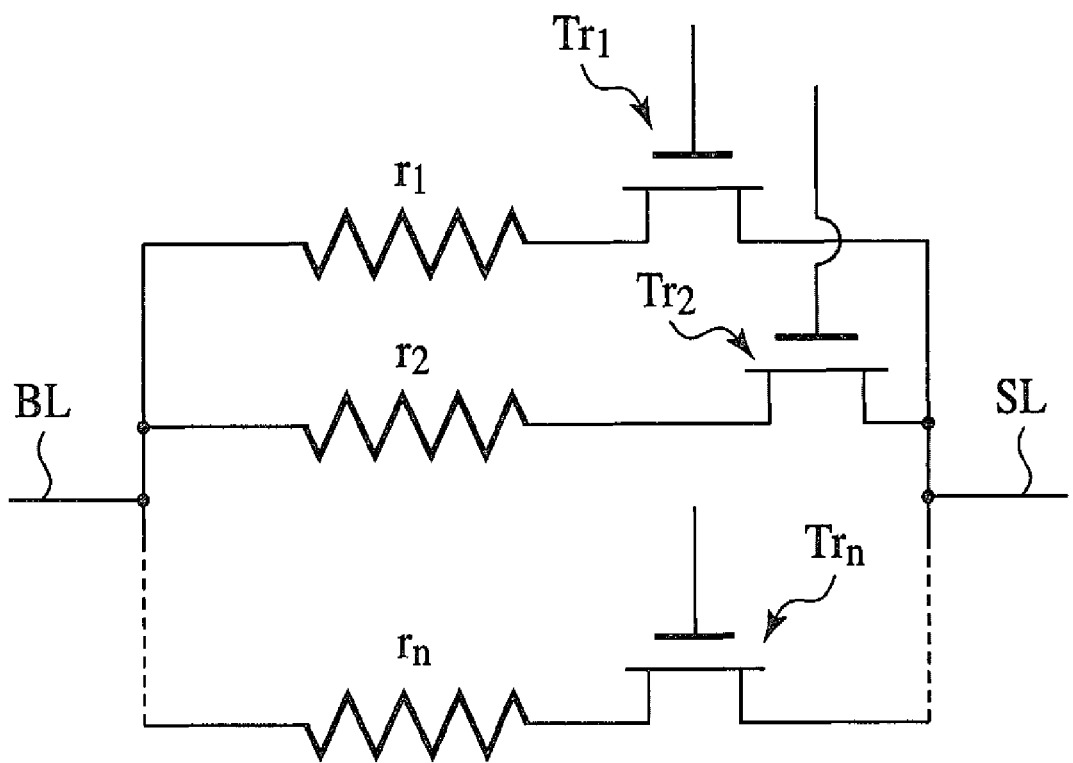
FIG. 12 is a circuit diagram showing the structure of the nonvolatile semiconductor memory device and the method of writing into the same according to a fifth embodiment of the present invention.

FIG. 12 is a circuit diagram showing the structure of the nonvolatile semiconductor memory device according to the present embodiment.

In the first and the second embodiments, the channel resistance $R_{JC}$ of the impedance control transistor 16 is controlled for controlling the current flowing in the bit line BL, but the method for controlling the current flowing in the bit line BL is not limited to this method. For example, the circuit shown in FIG. 12 may be provided in place of the impedance control transistor 16 shown in FIG. 6.

The circuit shown in FIG. 12 includes a plurality of serially connected sets each including a resistor r and a select transistor Tr, which are parallelly arranged. The resistance values of the resistors $r_1, r_2, \ldots, r_n$ are set suitably corresponding to the writing/reading characteristics of the nonvolatile semiconductor memory device.

In the circuit shown in FIG. 12, at least one of the select transistors $Tr_1, Tr_2, \ldots, Tr_n$ is turned on, whereby the resistors $r_1, r_2, \ldots, r_n$ are serially connected to the bit line BL. The impedance of the memory cell can be changed only by switching the select transistors $Tr_1, Tr_2, \ldots, Tr_n$ to be turned on, which facilitates the control in comparison with controlling the channel resistance $R_{JC}$ of the impedance control transistor 16.

Two or more of the select transistors Tr may be turned on at once. For example, in the circuit including the resistor $r_1$ and the resistor $r_2$, the resistance value with the select transistor $Tr_1$ turned on is $r_1$, and the resistance value with the select transistor $Tr_2$ turned on is $r_2$. The resistance value with the select transistors $Tr_1$, $Tr_2$ turned on at once is $r_1 r_2/(r_1+r_2)$. Accordingly, the select transistors Tr to be turned on are suitably combined, whereby more resistance states can be realized, which can simplify the circuit structure.

As described above, according to the present embodiment, the impedance of the memory cell can be easily controlled. Thus, the impedance mismatching in the setting and resetting can be mitigated.

A Sixth Embodiment

The nonvolatile semiconductor memory device and the method of manufacturing the same according to a sixth embodiment of the present invention will be explained with reference to FIGS. 13 to 15E.

Figure 13:
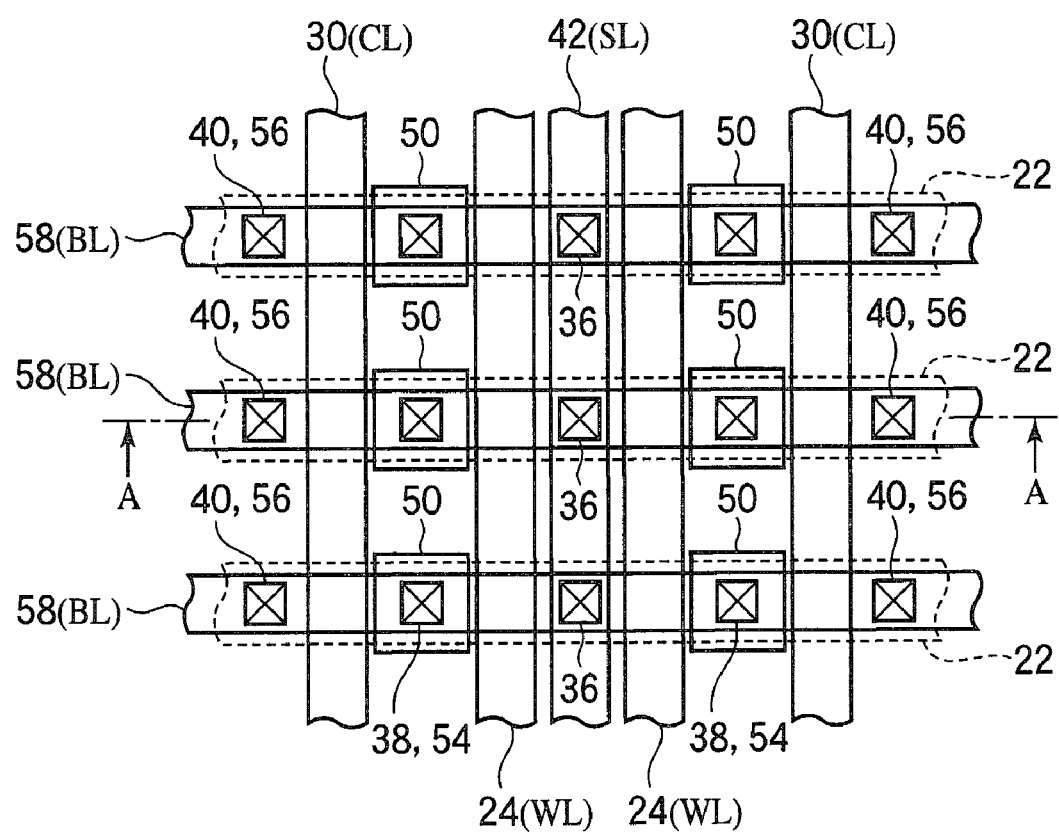
FIG. 13 is a plan view showing the structure of the nonvolatile semiconductor memory device according to a sixth embodiment of the present invention.
Figure 14:
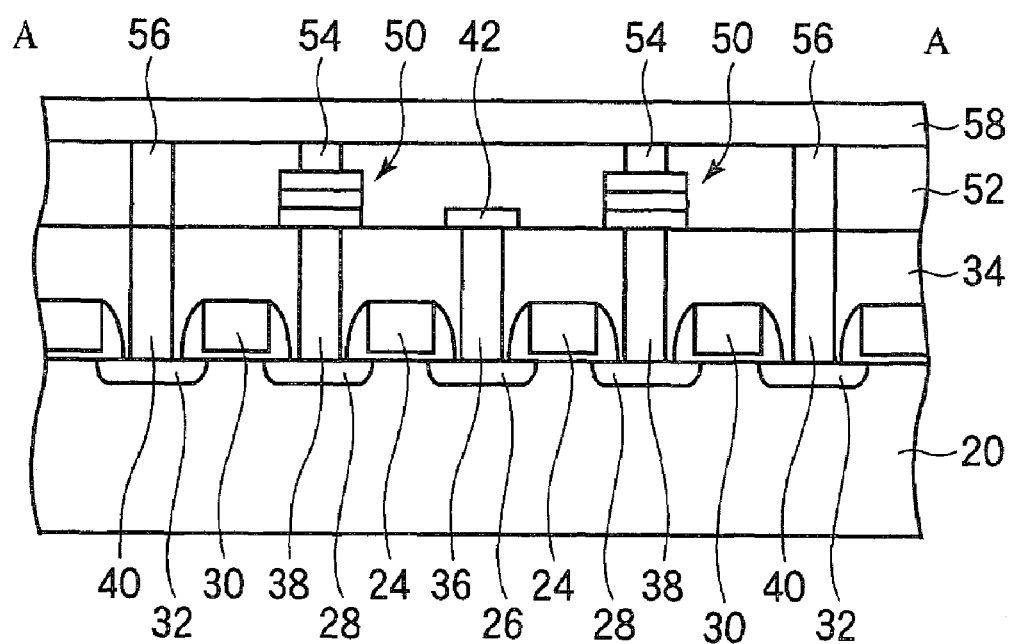
FIG. 14 is a diagrammatic sectional view showing the structure of the nonvolatile semiconductor memory device according to the sixth embodiment of the present invention.

FIG. 13 is a plan view showing the structure of the nonvolatile semiconductor memory device according to the present embodiment. FIG. 14 is a diagrammatic sectional view showing the structure of the nonvolatile semiconductor memory device according to the present embodiment. FIGS. 15A-15E are sectional views showing the method of manufacturing the nonvolatile semiconductor memory device according to the present embodiment.

In the present embodiment, the specific structure of the nonvolatile semiconductor memory device according to the third embodiment described above, and the method of manufacturing the same will be explained.

First, the structure of the nonvolatile semiconductor memory device according to the present embodiment will be explained with reference to FIGS. 13 and 14.

In a silicon substrate 20, a device isolation film 22 for defining device regions is formed. In the device regions in the silicon substrate 20, cell select transistors each including a gate electrode 24 and source/drain regions 26, 28, and current control transistors each including a gate electrode 30 and source/drain regions 28, 32 are formed.

As shown in FIG. 13, the gate electrodes 24 function also as word lines WL and the gate electrodes 24 of the cell select transistors adjacent column-wise are commonly connected to, and the gate electrodes 30 function also as control lines CL and the gate electrodes 30 of the column-wise adjacent impedance control transistors are commonly connected to.

Over the silicon substrate 10 with the cell select transistors and the current control transistors formed on, an inter-layer insulating film 34 with contact plugs 36 electrically connected to the source/drain regions 26, contact plugs 38 electrically connected to the source/drain regions 28 and contact plugs 40 electrically connected to the source/drain regions 32 buried in is formed.

On the inter-layer insulating film 34 with the contact plugs 36, 38, 40 buried in, source lines 42 electrically connected to the source/drain regions 26 via the contact plugs 36 and resistance memory elements 50 electrically connected to the source/drain regions 28 via the contact plugs 38 are formed.

Over the inter-layer insulating film 34 with the source lines 42 and the resistance memory elements 50 formed on, an inter-layer insulating film 52 with contact plugs 54 electrically connected to the resistance memory elements 50 and contact plugs 56 electrically connected to the contact plugs 40 buried in is formed.

On the inter-layer insulating film 52 with the contact plugs 54, 56 buried in, bit lines 58 electrically connected to the source/drain regions 32 via the contact plugs 56, 40 are formed.

Thus, the nonvolatile semiconductor memory device according to the third embodiment shown in FIG. 11 is constituted.

Next, the method of manufacturing the nonvolatile semiconductor memory device according to the present embodiment will be explained with reference to FIGS. 15A to 16B.

First, the device isolation film 22 for defining the device regions is formed in the silicon substrate 20 by, e.g., STI (Shallow Trench Isolation) method.

Figure 15A:
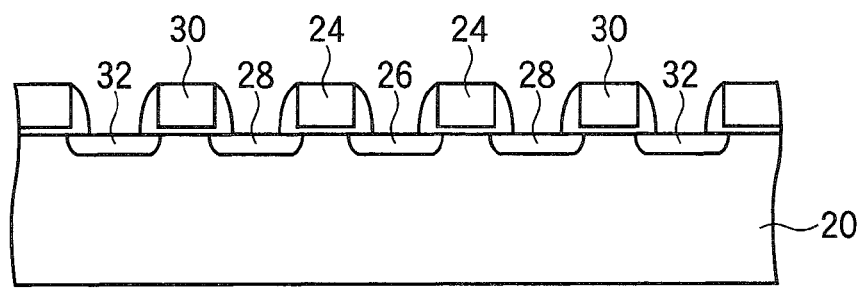
FIGS. 15A-15E are sectional views showing the method of manufacturing the nonvolatile semiconductor memory device according to the sixth embodiment of the present invention.

Then, in the device regions of the silicon substrate 20, in the same way as in the method of manufacturing the usual MOS transistor, the cell select transistors each including the gate electrode 24 and the source/drain regions 26, 28 and the impedance control transistors each including the gate electrode 30 and the source/drain regions 28, 32 are formed (FIG. 15A). The source/drain regions 28 are common among the cell select transistors ad the impedance control transistors.

Over the silicon substrate 20 with the cell select transistors and the current control transistors formed on, a silicon oxide film is deposited by, e.g., CVD method to form the inter-layer insulating film 34 of the silicon oxide film.

Then, by lithography and dry etching, contact holes down to the source/drain regions 26, 28, 32 are formed in the inter-layer insulating film 34.

Figure 15B:
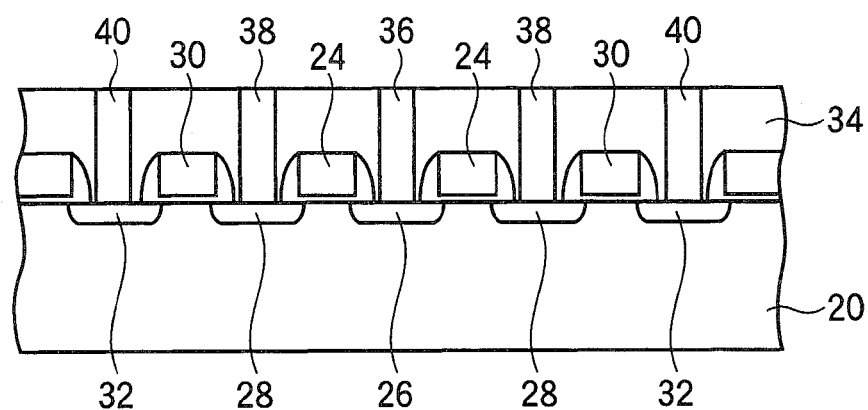

Next, a barrier metal and a tungsten film are deposited by, e.g., CVD method, and then these conductive films are etched back to form in the inter-layer insulating film 34 the contact plugs 36, 38, 40 electrically connected to the source/drain regions 26, 28, 32 (FIG. 15B).

Figure 15C:
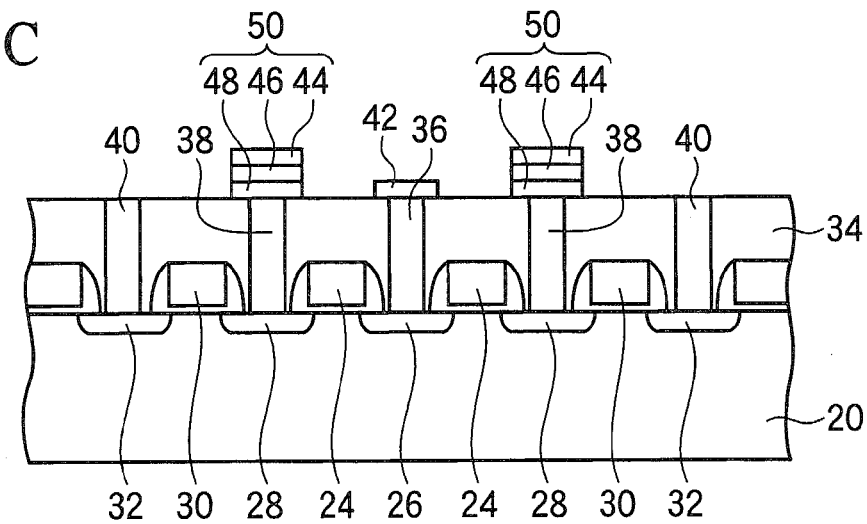

Then, on the inter-layer insulating film 34 with the contact plugs 36, 38, 40 buried in, the source lines 42 electrically connected to the source/drain regions 26 via the contact plugs 36 and the resistance memory elements 50 electrically connected to the source/drain regions 28 via the contact plugs 38 are formed (FIG. 15C).

The resistance memory elements 50 each includes a lower electrode 44 connected to the contact plug 38, a resistance memory material layer 46 formed on the lower electrode 44 and an upper electrode 48 formed on the resistance memory material layer 46.

In the case that the resistance memory material layer 46 is formed of the bipolar resistance memory material, for example, $Pr_{1-x}Ca_xMnO_3$ ($x \leq 1$), $La_{1-x}Ca_xMnO_3$ ($x \leq 1$), and $SrTiO_3$ or $SrZrO_3$ doped with Cr, Nb or others is formed by laser ablation, sol-gel, sputtering, MOCVD or other methods. In the case that the resistance memory material 46 is formed of the unipolar resistance memory material, for example, $NiO_y$ ($y \leq 1$), $TiO_z$ ($z \leq 2$), $HfO_z$ ($z \leq 2$) or others is formed by sol-gel, sputtering, MOCVD or other methods.

Then, over the inter-layer insulating film 34 with the source lines 42 and the resistance memory elements 50 formed on, a silicon oxide film is deposited by, e.g., CVD method to form the inter-layer insulating film 52 of the silicon oxide film.

Then, by lithography and dry etching, in the inter-layer insulating film 52, the contact holes down to the upper electrodes 48 of the resistance memory elements 50 and the contact holes down to the contact plugs 40 are formed.

Figure 15D:
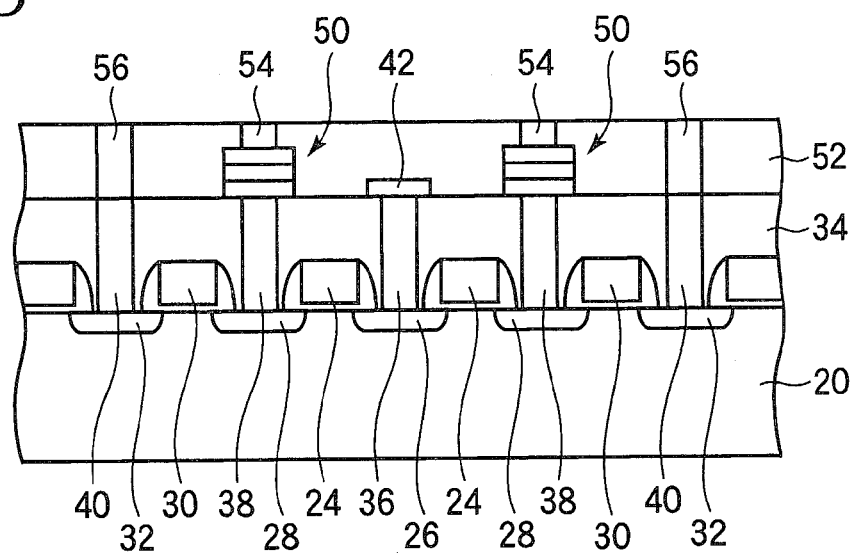

Next, a barrier metal and a tungsten film are deposited by, e.g., CVD method, and then these conductive films are etched back to form in the inter-layer insulating film 32 the contact plugs 54 electrically connected to the upper electrodes 48 of the resistance memory elements 50 and the contact plugs 56 electrically connected to the contact plugs 40 (FIG. 15D).

Figure 15E:
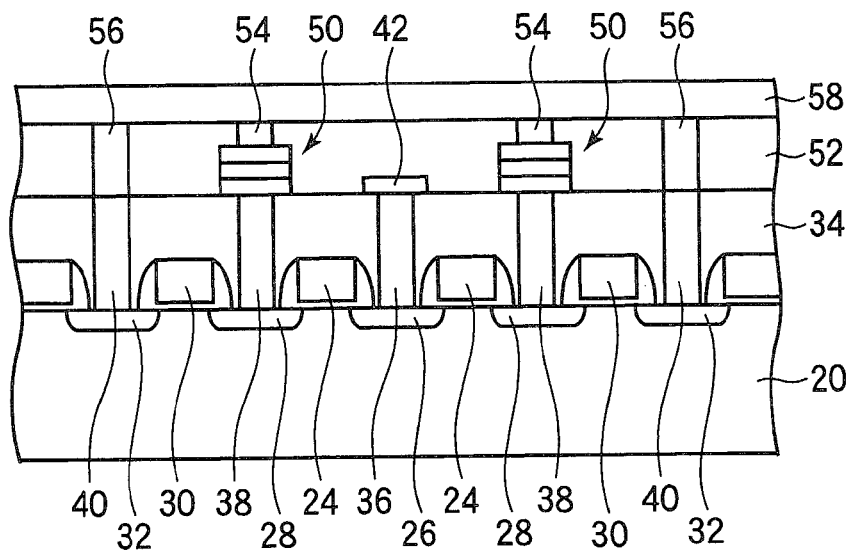

Then, on the inter-layer insulating film 52 with the contact plugs 54, 56 buried in, a conductive film is deposited, and then the conductive film is patterned by photolithography and dry etching to form the bit lines 58 electrically connected to the source/drain regions 32 via the contact plugs 56, 40 (FIG. 15E).

Then, upper level interconnection layers as required are formed thereon, and the nonvolatile semiconductor memory device is completed.

Modified Embodiments

The present invention is not limited to the above-described embodiments and can cover other various modifications.

For example, in the above-described embodiments, as the unipolar resistance memory material, $TiO_x$ is used, and Cr-doped $SrZrO_3$ is used as the bipolar resistance memory material. However, the material forming the resistance memory element is not limited to them. For example, as the unipolar resistance memory material, $NiO_x$, etc. can be used, and as the bipolar resistance memory material, Cr-doped $SrTiO_3$, $Pr_{1-x}Ca_xMnO_3$, $La_{1-x}Ca_xMnO_3$, etc., which exhibit CMR (Colossal Magneto-Resistance) can be used. In the setting and resetting, it is preferable to set the applied voltages and current limit values suitably corresponding to the kinds of the resistance memory material, structures of the resistance memory elements, etc.

In the above-described embodiment, in the setting operation, to make the impedance as seen from the outside of the memory cell in the setting operation and the impedance as seen from the outside of the memory cells in the resetting operation substantially equal to each other, the channel resistance $R_{IC}$ of the impedance control transistor 16 in the setting operation and the channel resistance $R_{IC}$ of the impedance control transistor 16 in the resetting operation are set not more than the resistance value $R_L$ in the low resistance state. However, it is not essentially necessary to make the impedance as seen from the outside of the memory cells in the setting operation and the impedance as seen from the outside of the memory cells in the resetting operation equal to each other. The channel resistance $R_{IC}$ of the impedance control transistor 16 may be suitably set so that in the setting operation, the impedance as seen from the outside of the memory cell makes the impedance-matching with the writing circuit, and in the resetting operation, the impedance as seen from the outside of the memory cell makes the impedance matching with the writing circuit, respectively.

In terms of the impedance matching with the writing circuit, it is idealistic that the impedance as seen from the outside of the memory cell in the setting operation is equal to the impedance as seen from the outside of the memory cell in the resetting operation. Actually, however, it is difficult to make the impedance of the memory cell the same in both operations, and it suffices to approximate the impedance as seen from the outside of the memory cell in the setting operation and the impedance as seen from the outside of the memory cell in the resetting operation to the impedance of the writing circuit in the range that no problems, such as reflections of the writing voltage pulses, etc., are caused to the writing characteristics. The allowable range of the deviation from the impedance of the writing circuit is preferably set suitably depending on pulse widths of the writing voltage pulse, other writing conditions, etc.

In the above-described embodiments, the impedance control transistor 16 is driven in the setting operation and the resetting operation. However, the impedance control transistor 16 may be driven only in the setting operation. In this case, the channel resistance of the impedance control transistor 16 may be controlled so that the impedance as seen from the outside of the memory cells in the high resistance state is equal or approximate to the resistance value $R_L$ of the low resistance state. In the resetting operation as well, the impedance control transistor 16 is driven to set the resistance value thereof above the resistance value $R_H$ in the high resistance state.

Figure 16:
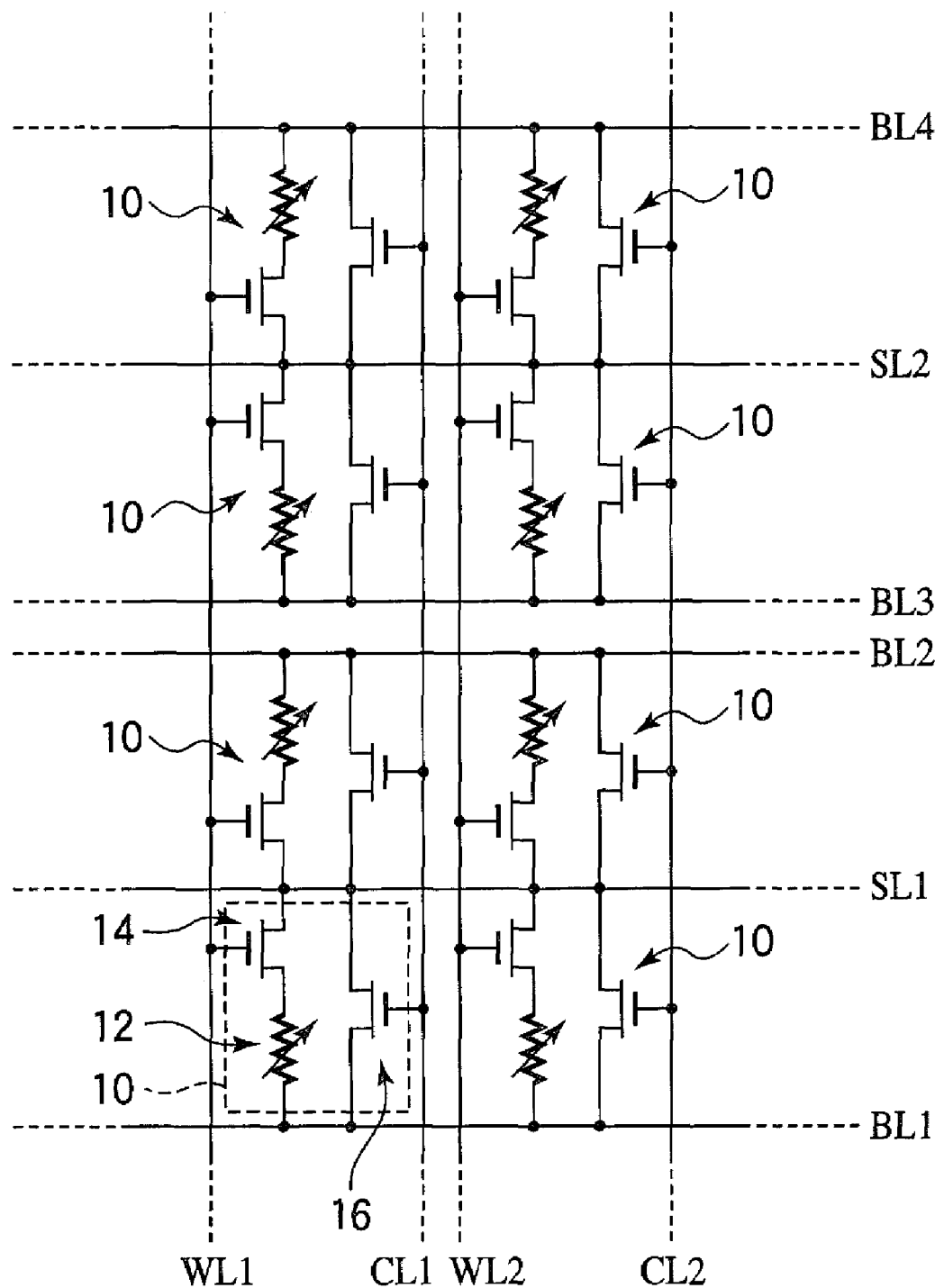
FIG. 16 is a circuit diagram showing the structure of the nonvolatile semiconductor memory device according to a modification of the embodiments of the present invention.

In the above-described embodiments, the source lines SL are arranged in parallel with the word lines WL but may be arranged in parallel with the bit lines BL. For example, in the nonvolatile semiconductor memory device according to the third and the fourth embodiments, as shown in FIG. 16, the source lines SL1, SL2, . . . may be extended column direction between adjacent ones of the memory cells. In FIG. 16, the impedance control transistor 16 is arranged between the bit lines BL and the source lines SL, but as shown in FIG. 10, the impedance control transistor 16 may be parallelly connected to the resistance memory elements 12.

In the above-described embodiments, one memory cell includes one cell select transistor and one resistance memory element, but the structure of the memory cell is not limited to this. For example, one memory cell may include one cell select transistor and two resistance memory elements or may include two cell select transistors and two resistance memory elements, and these structures are expected to improve the reading margin and produce other advantageous effects.

INDUSTRIAL APPLICABILITY

The nonvolatile semiconductor memory device and the method of writing into the same according to the present invention can easily make the impedance-matching with the peripheral circuit and the memory cell both when the resistance memory element is rewritten from the high resistance state to the low resistance state and is rewritten from the low resistance state to the high resistance state. Thus, the nonvolatile semiconductor memory device and the method of writing into the same according to the present invention are very useful to improve the reliability and operation speed of the nonvolatile semiconductor memory device.

What is claimed is:

1. A method of writing into a nonvolatile semiconductor memory device including a resistance memory element which memorizes a high resistance state and a low resistance state and switches between the high resistance state and the low resistance state by an application of a voltage, the method comprising:
   connecting, in parallel, a variable resistor including a plurality of resistors connected in parallel to the resistance memory element; and
   selecting at least one resistor of the variable resistor connected to the resistance memory element when the voltage is applied to resistance memory element to switch the resistance memory element between the high resistance state and the low resistance state, a resistance value of the variable resistor being set corresponding to a resistance state of the resistance memory element so that a writing circuit for applying the voltage to the resistance memory element, and a synthetic resistor of the resistance memory element and the variable resistor make the impedance-matching.

2. The method of writing into a nonvolatile semiconductor memory device according to claim 1, wherein
   the variable resistor is a MIS transistor.

3. A method of writing into a nonvolatile semiconductor memory device including a resistance memory element which memorizes a high resistance state and a low resistance state and switches between the high resistance state and the low resistance state by an application of a voltage,
   a variable resistor being parallelly connected to the resistance memory element, and when the voltage is applied to resistance memory element to switch the resistance memory element between the high resistance state and the low resistance state, a resistance value of the variable resistor being set so that a synthetic resistance value of the resistance memory element and the variable resistor is not more than a low resistance value of the low resistance state.

4. The method of writing into a nonvolatile semiconductor memory device according to claim 3, wherein
   the resistance value of the variable resistor is set so that a first synthetic resistance value of the resistance memory element and the variable resistor at a time when the resistance memory element is switched from the high resistance state to the low resistance state, and a second synthetic resistance value of the resistance memory element and the variable resistor at a time when the resistance memory element is switched from the low resistance state to the high resistance state become equal to each other.

5. The method of writing into a nonvolatile semiconductor memory device according to claim 4, wherein
   when the resistance memory element is written from the high resistance state to the low resistance state and when the resistance memory element is rewritten from the low resistance state to the high resistance state, the resistance value of the variable resistor is set not more than the low resistance value of the low resistance state.

6. The method of writing into a nonvolatile semiconductor memory device according to claim 3, wherein
   the variable resistor is a MIS transistor.

7. The method of writing into a nonvolatile semiconductor memory device according to claim 3, wherein
   the variable resistor includes a plurality of resistor parallelly connected, and
   the resistor connecting to the resistance memory element is selected to thereby control the resistance values of the variable resistor.

8. The method of writing into a nonvolatile semiconductor memory device according to claim 4, wherein
   when the resistance memory element is written from the high resistance state to the low resistance state, the resistance value of the variable resistor is made equal to the low resistance value of the low resistance state, and
   when the resistance memory element is written from the low resistance state to the high resistance state, the resistance value of the variable resistor is set not less than a high resistance value of the high resistance state.

9. A nonvolatile semiconductor memory device comprising:
   a resistance memory element which memorizes a high resistance state and a low resistance state and switches between the high resistance state and the low resistance state by an application of a voltage;
   a variable resistor connected, in parallel, to the resistance memory element; and
   a resistance control circuit which, when the voltage is applied to resistance memory element to switch the resistance memory element between the high resistance state and the low resistance state, sets a resistance value of the variable resistor corresponding to a resistance state of the resistance memory element so that a synthetic resistance value of the resistance memory element and the variable resistor is not more than a low resistance value of the low resistance state so that a writing circuit for applying the voltage to the resistance memory element, and a synthetic resistor of the resistance memory element and the variable resistor make the impedance-matching.

10. The nonvolatile semiconductor memory device according to claim 9, wherein
the variable resistor is a MIS transistor.

11. The nonvolatile semiconductor memory device according to claim 9, wherein
the variable resistor includes a plurality of resistors connected in parallel, and
at least one resistor of the variable resistor connecting to the resistance memory element is selected by the resistance control circuit to thereby set the resistance value of the variable resistor.

12. A nonvolatile semiconductor memory device comprising:
a plurality of memory cells arranged in a matrix, each of which includes a resistance memory element which memorizes a high resistance state and a low resistance state and switches between the high resistance state and the low resistance state by an application of a voltage, and a select transistor having one terminal serially connected to one terminal of the resistance memory element;
a plurality of first signal lines extended, in parallel, in a first direction, each signal line being connected to gate electrodes of the select transistors of the memory cells arranged in the first direction;
a plurality of second signal lines extended, in parallel, in a second direction intersecting the first direction, each signal line being connected to the other terminals of the resistance memory elements of the memory cells arranged in the second direction;
a plurality of third signal lines extended, in parallel, in the first direction or the second direction, each signal line being connected to the other terminals of the select transistors of the memory cells arranged in the first direction or the second direction;
a variable resistor connected, in parallel, to the resistance memory element; and
a resistance control circuit which, when the voltage is applied to resistance memory element to switch the resistance memory element between the high resistance state and the low resistance state, sets a resistance value of the variable resistor corresponding to the resistance state of the resistance memory element so that a synthetic resistance value of the resistance memory element and the variable resistor is not more than a low resistance value of the low resistance state so that a writing circuit for applying the voltage to the resistance memory element, and a synthetic resistor of the resistance memory element and the variable resistor make the impedance-matching.

13. The nonvolatile semiconductor memory device according to claim 12, wherein
the variable resistor is disposed between the second signal line and the third signal line associated with the memory cells arranged in the second direction.

14. The nonvolatile semiconductor memory device according to claim 12, in which
the variable resistor is respectively provided in each of the memory cells, and which further comprises
a plurality of fourth signal lines extended, in parallel, in the first direction, each signal line being connected to gate electrodes of the variable resistors of the memory cells arranged in the first direction.

* * * * *